US012787721B2

(12) United States Patent
Sun et al.

(10) Patent No.: US 12,787,721 B2
(45) Date of Patent: Nov. 3, 2026

(54) INTEGRATED DEVICE COMPRISING ELONGATED PADS

(71) Applicant: QUALCOMM Incorporated, San Diego, CA (US)

(72) Inventors: Yangyang Sun, San Diego, CA (US); Amer Christophe Gaetan Cassier, La Jolla, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 615 days.

(21) Appl. No.: 18/177,005

(22) Filed: Mar. 1, 2023

(65) Prior Publication Data

US 2024/0297129 A1 Sep. 5, 2024

(51) Int. Cl.

*H10P 74/00* (2026.01)
*H10W 72/00* (2026.01)
*H10W 72/20* (2026.01)
*H10W 72/90* (2026.01)

(52) U.S. Cl.

CPC ......... *H10P 74/273* (2026.01); *H10W 72/924* (2026.01); *H10W 72/926* (2026.01); *H10W 72/931* (2026.01); *H10W 72/967* (2026.01); *H10W 72/01955* (2026.01);

(Continued)

(58) Field of Classification Search

CPC . H10P 74/273; H10P 74/207; G01R 31/2884; H10W 72/932; H10W 72/936; H10W 72/944; H10W 72/983; H10W 72/967; H10W 72/924; H10W 72/931;

(Continued)

(56) References Cited

U.S. PATENT DOCUMENTS 5,844,317 A * 12/1998 Bertolet ................ H10P 74/273 257/781
6,380,555 B1 * 4/2002 Hembree .............. H10W 20/43 257/782

(Continued)

FOREIGN PATENT DOCUMENTS

CN 1262004 C * 6/2006 ............ H10W 72/90
EP 3937229 A1 1/2022

(Continued)

OTHER PUBLICATIONS

International Search Report and Written Opinion—PCT/US2024/014277—ISA/EPO—Jun. 10, 2024.

*Primary Examiner* — David A Zarneke
(74) *Attorney, Agent, or Firm* — Loza & Loza, LLP

(57) ABSTRACT

A device comprising an integrated device. The integrated device comprising a die substrate; an interconnect portion coupled to the die substrate, a plurality of pillar interconnects and a passivation layer coupled to the interconnect portion. The interconnect portion includes a first plurality of pads and a second plurality of pads. The first plurality of pads are configured to provide a first plurality of electrical paths for input/output signals. The second plurality of pads are configured to provide a second plurality of electrical paths for power. The plurality of pillar interconnects are coupled to the first plurality of pads and the second plurality of pads. The passivation layer comprises a plurality of openings. The plurality of openings include at least one opening located over a pad from the first plurality of pads.

20 Claims, 15 Drawing Sheets

AA CROSS SECTION PLAN VIEW

(52) U.S. Cl.
CPC .... *H10W 72/07253* (2026.01); *H10W 72/232* (2026.01); *H10W 72/244* (2026.01)

(58) Field of Classification Search
CPC ........... H10W 72/926; H10W 72/9445; H10W 72/90
See application file for complete search history.

(56) References Cited

U.S. PATENT DOCUMENTS

| | | | | |
|---|---|---|---|---|
| 6,534,853 | B2 * | 3/2003 | Liu | H10P 74/277 257/691 |
| 6,563,226 | B2 * | 5/2003 | Harun | H10W 72/50 257/784 |
| 6,861,749 | B2 * | 3/2005 | Wu | H10P 74/273 257/737 |
| 6,897,669 | B2 * | 5/2005 | Ishio | H10P 74/273 324/754.03 |
| 7,064,450 | B1 * | 6/2006 | Eghan | H10P 74/273 257/773 |
| 7,235,412 | B1 * | 6/2007 | Mardi | H10P 74/273 438/18 |
| 7,294,930 | B2 * | 11/2007 | Tanabe | H10P 74/273 257/E23.179 |
| 7,307,342 | B2 * | 12/2007 | Jeong | H10W 72/019 257/737 |
| 7,394,161 | B2 * | 7/2008 | Kuo | H10P 74/273 257/784 |
| 8,067,950 | B2 | 11/2011 | Nagai et al. | |
| 8,558,229 | B2 * | 10/2013 | Jeng | H10P 74/277 257/E23.021 |
| 8,581,250 | B2 * | 11/2013 | Chen | H10P 74/273 257/782 |
| 8,691,601 | B2 * | 4/2014 | Izuha | G01R 31/2853 257/E21.531 |
| 9,209,144 | B1 * | 12/2015 | Ngion | H10P 54/00 |
| 9,553,065 | B2 * | 1/2017 | Lin | H10W 74/129 |
| 10,340,203 | B2 * | 7/2019 | Shih | H10W 20/20 |
| 10,483,174 | B1 * | 11/2019 | Liu | H10P 74/273 |
| 12,288,759 | B2 * | 4/2025 | Liu | H10P 74/273 |
| 2005/0248011 | A1 * | 11/2005 | Jung | H10W 72/20 257/678 |
| 2006/0164110 | A1 * | 7/2006 | Miyazaki | G01R 3/00 324/762.01 |
| 2007/0221920 | A1 * | 9/2007 | Mardi | H10P 74/273 257/48 |
| 2008/0303177 | A1 * | 12/2008 | Wu | H10P 74/273 257/E23.141 |
| 2013/0175528 | A1 * | 7/2013 | Han | H10P 74/273 257/E23.021 |
| 2019/0080993 | A1 | 3/2019 | Chen et al. | |
| 2020/0035631 | A1 | 1/2020 | Chang | |
| 2021/0305184 | A1 * | 9/2021 | Zhang | H10W 70/65 |
| 2023/0317532 | A1 * | 10/2023 | Jung | H10P 74/273 |
| 2023/0384367 | A1 * | 11/2023 | Sun | G01R 31/2884 |
| 2023/0395543 | A1 * | 12/2023 | Tian | H10P 74/273 |
| 2024/0112963 | A1 * | 4/2024 | Chen | H10P 74/273 |
| 2024/0153898 | A1 * | 5/2024 | Ji | H10W 46/00 |

FOREIGN PATENT DOCUMENTS

| | | | | | |
|---|---|---|---|---|---|
| JP | 2007242782 | A | * | 9/2007 | H10W 72/90 |
| JP | 2010123602 | A | * | 6/2010 | H10W 72/20 |
| WO | WO-2011104779 | A1 | * | 9/2011 | H10W 74/15 |

* cited by examiner

CROSS SECTIONAL PROFILE VIEW

CROSS SECTIONAL PROFILE VIEW

CROSS SECTIONAL PROFILE VIEW

CROSS SECTIONAL PROFILE VIEW

CROSS SECTIONAL PROFILE VIEW

CROSS SECTIONAL PROFILE VIEW

CROSS SECTION PLAN VIEW

AA CROSS SECTION PLAN VIEW

BB CROSS SECTION PLAN VIEW

CROSS SECTIONAL PROFILE VIEW

CROSS SECTIONAL PROFILE VIEW

AA CROSS SECTION PLAN VIEW

INTEGRATED DEVICE COMPRISING ELONGATED PADS

FIELD

Various features relate to integrated devices.

BACKGROUND

A package may include a substrate and integrated devices. These components are coupled together to provide a package that may perform various functions. The performance of a package and its components may depend on the configuration and/or size of interconnects in the integrated devices. There is an ongoing need to provide packages and/or integrated devices that include smaller and/or finer interconnects while still being able to test the integrated devices before the integrated devices are coupled to other components.

SUMMARY

Various features relate to integrated devices.

One example provides a device comprising an integrated device. The integrated device comprises a die substrate; an interconnect portion coupled to the die substrate, a plurality of pillar interconnects and a passivation layer coupled to the interconnect portion. The interconnect portion includes a first plurality of pads and a second plurality of pads. The first plurality of pads are configured to provide a first plurality of electrical paths for input/output signals. The second plurality of pads are configured to provide a second plurality of electrical paths for power. The plurality of pillar interconnects are coupled to the first plurality of pads and the second plurality of pads. The passivation layer comprises a plurality of openings. The plurality of openings include at least one opening located over a pad from the first plurality of pads.

Another example provides an integrated device comprising a die substrate; an interconnect portion coupled to the die substrate, and a passivation layer coupled to the interconnect portion. The interconnect portion includes a first plurality of pads and a second plurality of pads. The first plurality of pads are configured to provide a first plurality of electrical paths for input/output signals. The second plurality of pads are configured to provide a second plurality of electrical paths for power. The passivation layer comprises a plurality of openings. The plurality of openings include at least two openings located over a pad from the first plurality of pads.

Another example provides a method for fabricating an integrated device. The method provides a die substrate. The method provides an interconnect portion that is coupled to the die substrate. The interconnect portion includes a first plurality of pads and a second plurality of pads. The first plurality of pads are configured to provide a first plurality of electrical paths for input/output signals. The second plurality of pads are configured to provide a second plurality of electrical paths for power. The method provides a passivation layer that is coupled to the interconnect portion. The passivation layer comprises a plurality of openings. The plurality of openings include at least two opening located over a pad from the first plurality of pads.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a device comprising an integrated device. The integrated device comprises a die substrate; an interconnect portion coupled to the die substrate, a plurality of pillar interconnects and a passivation layer coupled to the interconnect portion. The interconnect portion includes a first plurality of pads and a second plurality of pads. The first plurality of pads are configured to provide a first plurality of electrical paths for input/output signals. The second plurality of pads are configured to provide a second plurality of electrical paths for power. The plurality of pillar interconnects are coupled to the first plurality of pads and the second plurality of pads. The passivation layer comprises a plurality of openings. The plurality of openings include at least one opening located over a pad from the first plurality of pads. The configuration of the pads and the openings in the passivation layer allow for pads that have smaller pitches, while still allowing a testing probe to touch the pad in order to test whether the integrated device works properly.

Exemplary Integrated Device Comprising Elongated Pads

Figure 1:
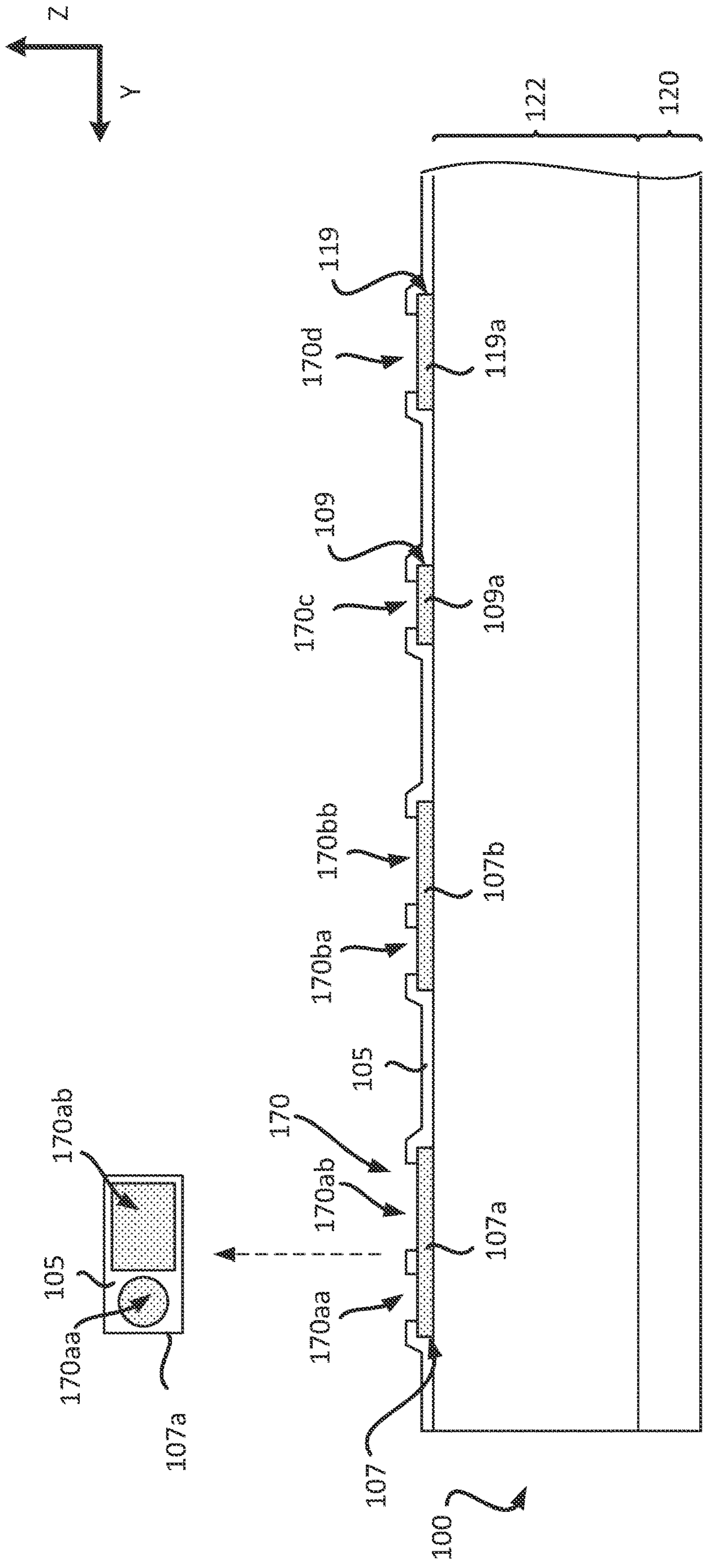
FIG. 1 illustrates a cross sectional profile view of an exemplary integrated device that includes elongated pads.

FIG. 1 illustrates a cross sectional profile view of an integrated device 100 that includes elongated pads. The integrated device 100 includes a die substrate 120, an interconnect portion 122, a passivation layer 105, a plurality of pads 107, a plurality of pads 109, and a plurality of pads 119. The die substrate 120 may include silicon (Si). A plurality of cells (e.g., logic cells) and/or a plurality of transistors (both not shown) may be formed in and/or over the die substrate 120. Different implementations may use different types of transistors, such as a field effect transistor (FET), planar FET, finFET, and a gate all around FET. In some implementations, a front end of line (FEOL) process may be used to fabricate the plurality of cells (e.g., logic cells) and/or transistors in and/or over the die substrate 120. The interconnect portion 122 is located over and coupled to the die substrate 120. The interconnect portion 122 may be coupled to the plurality of cells and/or transistors located in and/or over the die substrate 120. The interconnect portion 122 (e.g., die interconnect portion) may include a plurality of die interconnects that are coupled to the plurality of cells and/or transistors. In some implementations, a back end of line (BEOL) process may be used to fabricate the interconnect portion 122. As will be further described below in detail, two or more openings in the passivation layer may be located over one or more pads of an integrated device.

The plurality of pads 107 (e.g., first plurality of pads) are located over the interconnect portion 122. The plurality of pads 107 may be coupled to die interconnects of the interconnect portion 122. The plurality of pads 107 may include a pad 107*a* and a pad 107*b*. At least some of the pads from the plurality of pads 107 may have a rectangular shape and/or elongated shape. The plurality of pads 107 may be configured to provide at least one electrical path for input/output (I/O) signals for the integrated device 100. The plurality of pads 109 (e.g., second plurality of pads) are located over the interconnect portion 122. The plurality of pads 109 may be coupled to die interconnects of the interconnect portion 122. The plurality of pads 109 may include a pad 109*a*. The plurality of pads 109 may be configured to provide at least one electrical path for power for the integrated device 100. The plurality of pads 119 may be testing pads and/or landing pads for testing probes. The plurality of pads 119 may include a pad 119*a*. As will be further described below, the plurality of pads 119 may be configured to be coupled to other pads (e.g., 107, 109, 207, 310, 312) through one or more traces (e.g., traces located over the interconnect portion 122). One or more of the pads from the plurality of pads 119 may have a width and/or diameter that is greater than other pads (e.g., 107, 109, 207).

The passivation layer 105 is located over and coupled to the interconnect portion 122. The passivation layer 105 may be a hard passivation layer. The passivation layer 105 may include a dielectric. The passivation layer 105 may be located over the plurality of pads 107, the plurality of pads 109 and/or the plurality of pads 119. In some implementations, the passivation layer 105, the plurality of pads 107, the plurality of pads 109 and/or the plurality of pads 119 may be considered part of the interconnect portion 122. For example, the plurality of pads 107, the plurality of pads 109 and/or the plurality of pads 119 may be considered part of die interconnects of the interconnect portion 122. In some implementations, a back end of line (BEOL) process may be used to fabricate the passivation layer 105, the plurality of pads 107, the plurality of pads 109 and/or the plurality of pads 119. There may be a plurality of openings 170 in the passivation layer 105. The plurality of openings 170 may be located over the plurality of pads 107, the plurality of pads 109 and/or the plurality of pads 119. The plurality of openings 170 may include an opening 170*aa*, an opening 170*ab*, an opening 170*ba*, an opening 170*bb*, an opening 170*c* and an opening 170*d*. Different openings from the plurality of openings 170 may have similar or different shapes.

The opening 170*aa* and the opening 170*ab* are located over the pad 107*a*. The opening 170*aa* may have a circular shape. The opening 170*ab* may have a rectangular shape. The opening 170*aa* exposes a first portion of a surface of the pad 107*a*. The opening 170*ab* exposes a second portion of the surface of the pad 107*a*. The opening 170*ba* and the opening 170*bb* are located over the pad 107*b*. The opening 170*ba* exposes a first portion of a surface of the pad 107*b*. The opening 170*bb* exposes a second portion of the surface of the pad 107*b*. The opening 170*c* is located over the pad 109*a*. The opening 170*c* exposes a first portion of a surface of the pad 109*a*. The opening 170*d* is located over the pad 119*a*. The opening 170*d* exposes a first portion of a surface of the pad 119*a*. It is noted that a passivation layer may still be considered to have an opening even if the opening is subsequently filled and/or occupied by another material that is not the passivation layer.

In some implementations, a solder interconnect may be coupled to the pad 107*a* through the opening 170*aa* of the passivation layer 105. However, a solder interconnect is not touching the pad 107*a* through the opening 170*ab* of the passivation layer 105. During testing of the integrated device, a probe (e.g., testing probe) may be touching the pad 107*a* through the opening 170*ab* of the passivation layer 105. In some implementations, a solder interconnect may be coupled to the pad 107*b* through the opening 170*ba* of the passivation layer 105. However, a solder interconnect is not touching the pad 107*b* through the opening 170*bb* of the passivation layer 105. During testing of the integrated device, a probe (e.g., testing probe) may be touching the pad 107*b* through the opening 170*bb* of the passivation layer 105. During testing of the integrated device, a probe (e.g., testing probe) may be touching the pad 119*a* through the opening 170*d* of the passivation layer 105. In some implementations, the electrical connectivity of the pad 109*a* may be tested by testing the integrated device using a probe to touch the pad 119*a*. In such instances, the pad 119*a* may be configured to be electrically coupled to the pad 109*a* through one or more interconnects (e.g., die interconnects, traces).

As interconnects in an integrated device, get smaller and have smaller pitches, it becomes more difficult to test the integrated device without damaging the interconnects and/or the integrated device. Increasing the size and/or pitch between pads may not be practical or desirable due to design rules constraints on the integrated device and/or space constraints on the integrated device. In order for test probes to be able to properly test an integrated device, testing pads and/or landing pads are fabricated as part of an integrated device. The testing pads and/or landing pads may be larger in size and/or may have bigger pitches (relative to other pads) in order to not get damaged during testing of the integrated device and to accommodate the size of testing probes. These testing pads may be located in regions and/or areas that are not being used and/or occupied by other pads (e.g., core pads, periphery pads).

The configuration and/or arrangement of FIG. 1 allows for more compact, denser and/or finer pitches between pads, while still allowing enough space for testing probes to touch a portion of the pads to test whether the integrated device works properly.

Figure 2:
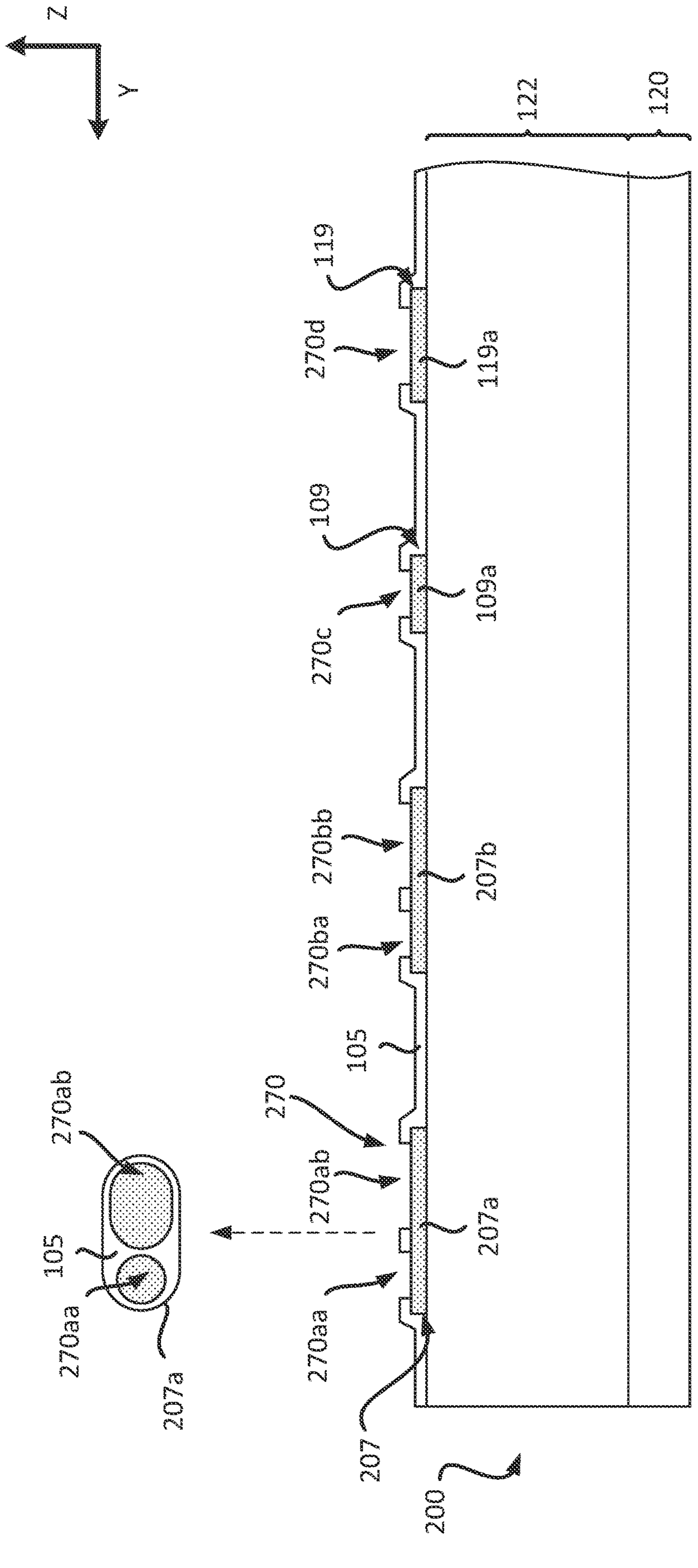
FIG. 2 illustrates a cross sectional profile view of an exemplary integrated device that includes elongated pads.

FIG. 2 illustrates a cross sectional profile view of an integrated device 200 that includes elongated pads. The integrated device 200 is similar to the integrated device 100 and includes the same and/or similar components as the integrated device 100. The integrated device 200 includes the die substrate 120, the interconnect portion 122, the passivation layer 105, a plurality of pads 207, the plurality of pads 109 and the plurality of pads 119.

The plurality of pads 207 may be similar to the plurality of pads 107. However, pads from the plurality of pads 207 may have a different shape from pads from the plurality of pads 107. The plurality of pads 207 (e.g., first plurality of pads) are located over the interconnect portion 122. The plurality of pads 207 may be coupled to die interconnects of the interconnect portion 122. The plurality of pads 207 may include a pad 207*a* and a pad 207*b*. At least some of the pads from the plurality of pads 207 may have an oval shape (e.g., oblong) and/or elongated shape. The plurality of pads 207 may be configured to provide at least one electrical path for input/output (I/O) signals for the integrated device 200.

There may be a plurality of openings 270 in the passivation layer 105. The plurality of openings 270 may be located over the plurality of pads 207, the plurality of pads 109 and/or the plurality of pads 119. The plurality of openings 270 may include an opening 270*aa*, an opening 270*ab*, an opening 270*ba*, an opening 270*bb*, an opening 270*c* and an opening 270*d*. Different openings may have similar or different shapes.

The opening 270*aa* and the opening 270*ab* are located over the pad 207*a*. The opening 270*aa* may have a circular shape. The opening 270*ab* may have an oval shape (e.g., oblong shape). The opening 270*aa* exposes a first portion of a surface of the pad 207*a*. The opening 270*ab* exposes a second portion of the surface of the pad 207*a*. The opening 270*ba* and the opening 270*bb* are located over the pad 207*b*. The opening 270*ba* exposes a first portion of a surface of the pad 207*b*. The opening 270*bb* exposes a second portion of the surface of the pad 207*b*. The opening 270*c* is located over the pad 109*a*. The opening 270*c* exposes a first portion of a surface of the pad 109*a*. The opening 270*d* is located over the pad 119*a*. The opening 270*d* exposes a first portion of a surface of the pad 119*a*.

In some implementations, a solder interconnect may be coupled to the pad 207*a* through the opening 270*aa* of the passivation layer 105. However, a solder interconnect is not touching the pad 207*a* through the opening 270*ab* of the passivation layer 105. During testing of the integrated device, a probe (e.g., testing probe) may be touching the pad 207*a* through the opening 270*ab* of the passivation layer 105. In some implementations, a solder interconnect may be coupled to the pad 207*b* through the opening 270*ba* of the passivation layer 105. However, a solder interconnect is not touching the pad 207*b* through the opening 270*bb* of the passivation layer 105. During testing of the integrated device, a probe (e.g., testing probe) may be touching the pad 207*b* through the opening 270*bb* of the passivation layer 105. During testing of the integrated device, a probe (e.g., testing probe) may be touching the pad 119*a* through the opening 270*d* of the passivation layer 105.

Figure 3:
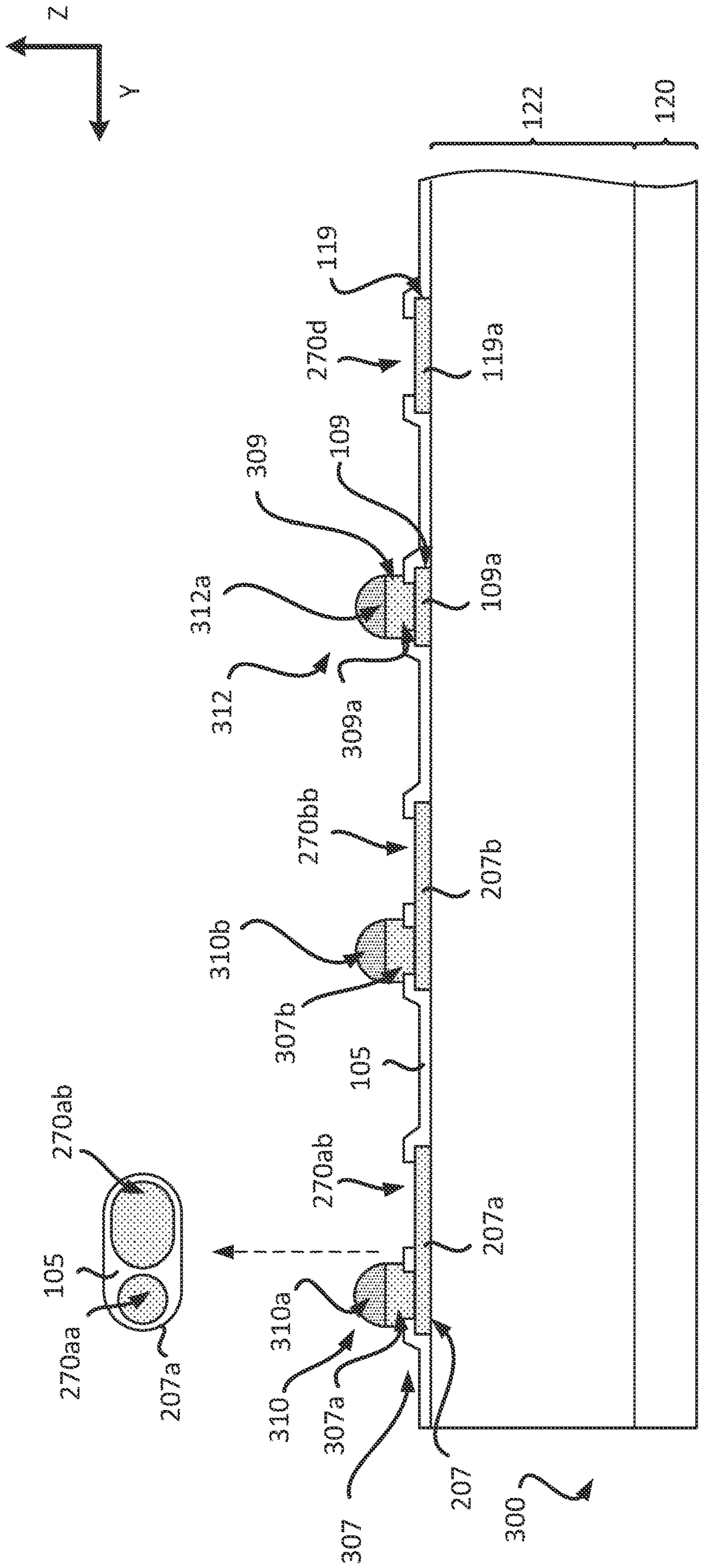
FIG. 3 illustrates a cross sectional profile view of an exemplary integrated device that includes elongated pads.

FIG. 3 illustrates a cross sectional profile view of an integrated device 300 that includes elongated pads. The integrated device 300 is similar to the integrated device 100 and/or the integrated device 200, and includes the same and/or similar components as the integrated device 100 and/or the integrated device 200. The integrated device 300 includes the die substrate 120, the interconnect portion 122, the passivation layer 105, the plurality of pads 207, the plurality of pads 109, a plurality of pillar interconnects 307, a plurality of pillar interconnects 309, a plurality of solder interconnects 310 and a plurality of solder interconnects 312. The plurality of pillar interconnects 307 include a pillar interconnect 307*a* and a pillar interconnect 307*b*. The plurality of pillar interconnects 309 include a pillar interconnect 309*a*. The plurality of solder interconnects 310 include a solder interconnect 310*a* and a solder interconnect 310*b*. The plurality of solder interconnects 312 include a solder interconnect 312*a*.

The pillar interconnect 307*a* is coupled to the pad 207*a* through the opening 270*aa* of the passivation layer 105. The solder interconnect 310*a* is coupled to the pillar interconnect 307*a*. A surface of the pad 207*a* that is exposed by the opening 270*ab* is not touching a solder interconnect. The pillar interconnect 307*b* is coupled to the pad 207*b* through the opening 270*ba* of the passivation layer 105. The solder interconnect 310*b* is coupled to the pillar interconnect 307*b*. A surface of the pad 207*b* that is exposed by the opening 270*bb* is not touching a solder interconnect. The pillar interconnect 309*a* is coupled to the pad 109*a* through the opening 270*c* of the passivation layer 105. The solder interconnect 312*a* is coupled to the pillar interconnect 309*a*.

Figure 4:
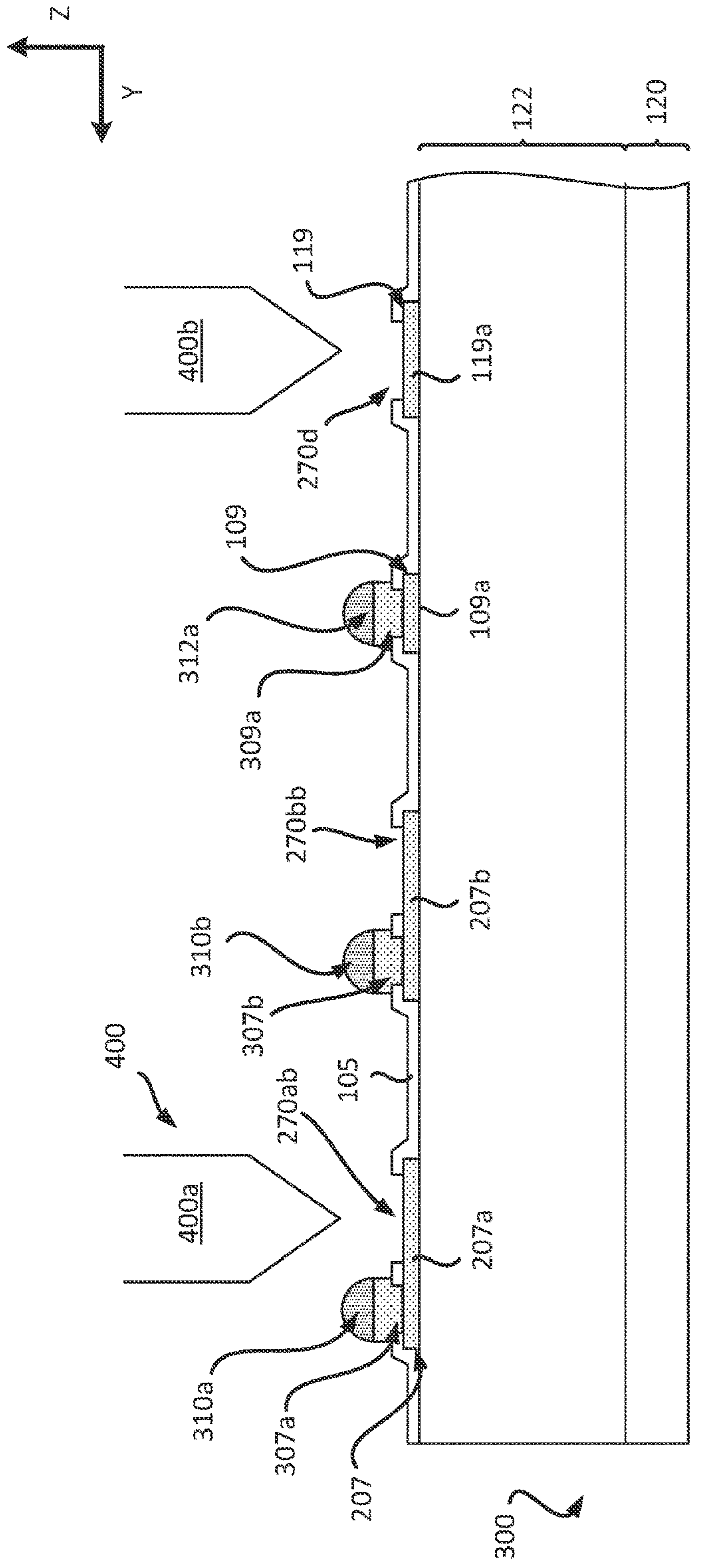
FIG. 4 illustrates a cross sectional profile view of an exemplary integrated device that includes elongated pads.

FIG. 4 illustrates the integrated device 300. A plurality of probes 400 may be used to test the integrated device 300. A probe 400*a* is shown being moved to touch the pad 207*a*. The probe 400*a* may be a testing probe for integrated devices. The probe 400*a* is configured to touch a surface of the pad 207*a* through the opening 270*ab* of the passivation layer 105. The probe 400*a* may be configured to test the integrated device by touching the surface of the pad 207*a*.

A probe 400*b* is shown being moved to touch the pad 119*a*. The probe 400*b* may be a testing probe. The probe 400*b* is configured to touch a surface of the pad 119*a* through the opening 270*d* of the passivation layer 105. The size of the pad 119*a* may be designed to accommodate the size of the probe 400*b*. Although two probes are shown, there may be multiple probes that may be configured to touch other pads (e.g., 207*b*) of the integrated device 300 through similar openings in the passivation layer 105. Using the elongated pads helps provide more compact, denser and/or finer pitches between pads, while still allowing enough space for testing probes to touch a portion of the pads to test whether the integrated device works properly. Once it is determined that the integrated device (e.g., 100, 200, 300) works properly, the integrated device can be coupled to other components, such as a substrate or a board (e.g., printed circuit board). In some implementations, the electrical connectivity of the pad 109*a* and the pillar interconnect 209*a* may be tested by testing the integrated device using a probe 400*b* to touch the pad 119*a*. The pad 119*a* may be configured to be electrically coupled to the pad 109*a* through one or more interconnects (e.g., traces).

Figure 5:
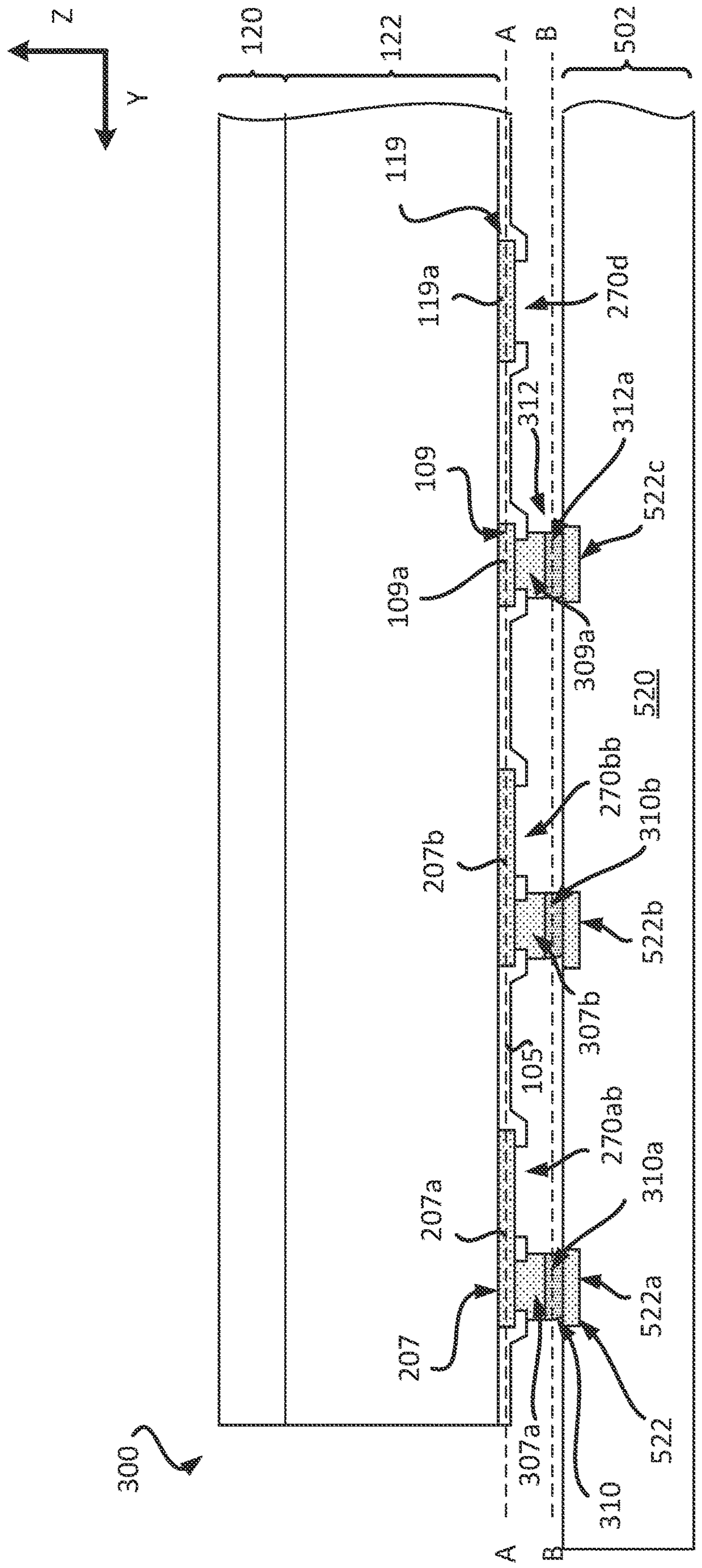
FIG. 5 illustrates a cross sectional profile view of an exemplary integrated device that includes elongated pads, where the integrated device is coupled to a substrate.

FIG. 5 illustrates an integrated device 300 that is coupled to the substrate 502. The substrate 502 includes at least one dielectric layer 520 and a plurality of interconnects 522 (e.g., substrate interconnects). The integrated device 300 is coupled to the substrate 502 through the plurality of solder interconnects 310 (e.g., first plurality of solder interconnects) and the plurality of solder interconnects 312 (e.g., second plurality of solder interconnects). The integrated device 300 is coupled to the plurality of interconnects 522 of the substrate 502 through the plurality of solder interconnects 310 and the plurality of solder interconnects 312. The pillar interconnect 307*a* is coupled to the solder interconnect 310*a*. The solder interconnect 310*a* is coupled to the interconnect 522*a* of the substrate 502. The pillar interconnect 307*b* is coupled to the solder interconnect 310*b*. The solder interconnect 310*b* is coupled to the interconnect 522*b* of the substrate 502. The pillar interconnect 309*a* is coupled to the solder interconnect 312*a*. The solder interconnect 312*a* is coupled to the interconnect 522*c* of the substrate 502.

FIG. 5 illustrates that a portion of a surface of the pad 207*a* is exposed by the opening 270*ab* of the passivation layer 105. The portion of the surface of the pad 207*a* that is exposed by the opening 270*ab* of the passivation layer 105 may be free of any direct contact with a solder interconnect and/or other interconnects. Moreover, a portion of a surface of the pad 207*b* is exposed by the opening 270*bb* of the passivation layer 105. The portion of the surface of the pad 207*b* that is exposed by the opening 270*bb* of the passivation layer 105 may be free of any direct contact with a solder interconnect and/or other interconnect. In addition, a portion of a surface of the pad 119*a* is exposed by the opening 270*d* of the passivation layer 105. The portion of the surface of the pad 119*a* that is exposed by the opening 270*d* of the passivation layer 105 may be free of any direct contact with a solder interconnect and/or other interconnect. However, it is noted there may be an underfill and/or a mold (both not shown) between the integrated device 300 and the substrate 502. Such an underfill and/or a mold may come into contact (e.g., may touch) the pad 207*a*, the pad 207*b* and/or the pad 119*a* through openings in the passivation layer 105.

It is noted that instead of a substrate, the integrated device 300 may be coupled to a board (e.g., printed circuit board) through the plurality of solder interconnects 310 and the plurality of solder interconnects 312.

Figure 6:
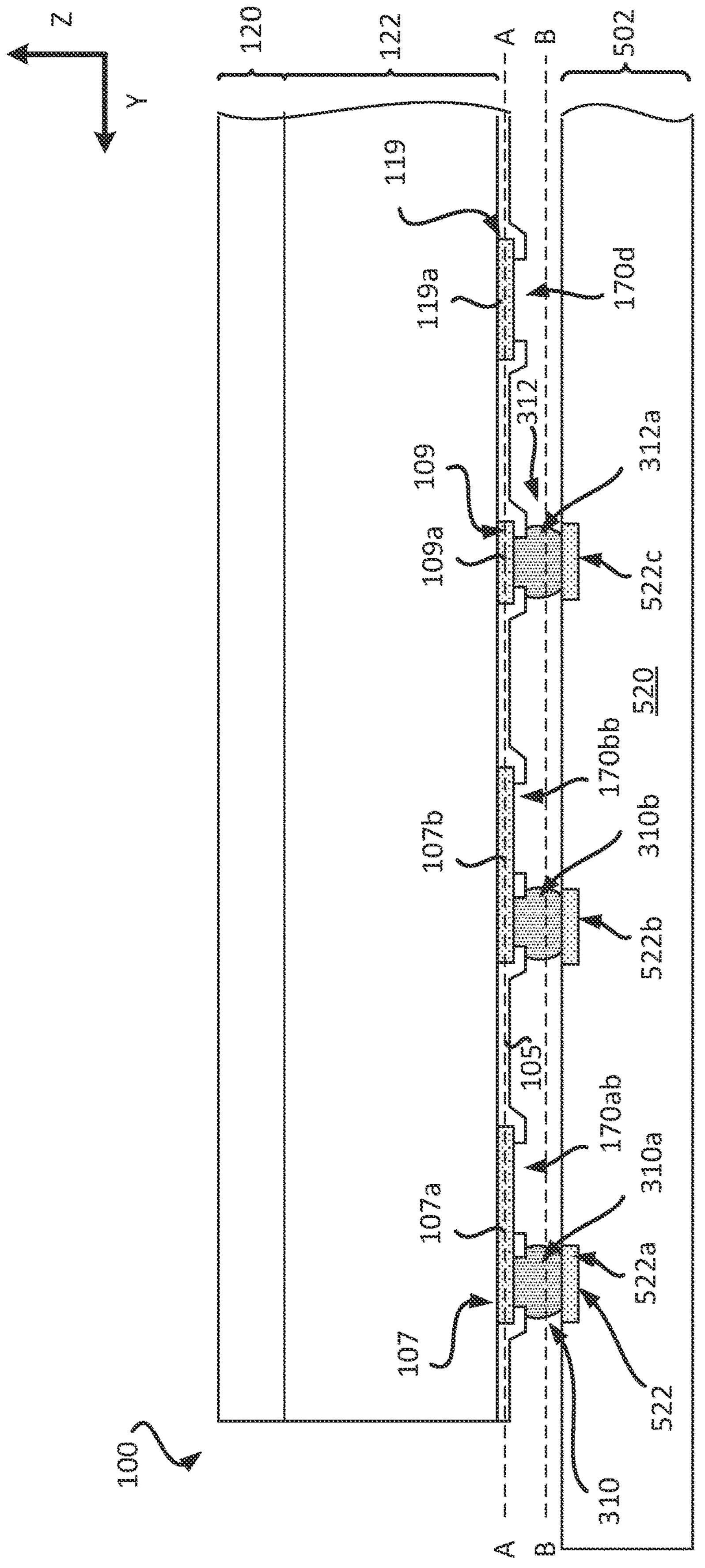
FIG. 6 illustrates a cross sectional profile view of an exemplary integrated device that includes elongated pads, where the integrated device is coupled to a substrate.

FIG. 6 illustrates an integrated device 100 that is coupled to the substrate 502. The substrate 502 includes at least one dielectric layer 520 and a plurality of interconnects 522 (e.g., substrate interconnects). The integrated device 100 is coupled to the substrate 502 through the plurality of solder interconnects 310 (e.g., first plurality of solder interconnects) and the plurality of solder interconnects 312 (e.g., second plurality of solder interconnects). The integrated device 100 is coupled to the plurality of interconnects 522 of the substrate 502 through the plurality of solder interconnects 310 and the plurality of solder interconnects 312. The pad 107*a* is coupled to the solder interconnect 310*a*. The solder interconnect 310*a* is coupled to the interconnect 522*a* of the substrate 502. The pad 107*b* is coupled to the solder interconnect 310*b*. The solder interconnect 310*b* is coupled to the interconnect 522*b* of the substrate 502. The pad 109*a* is coupled to the solder interconnect 312*a*. The solder interconnect 312*a* is coupled to the interconnect 522*c* of the substrate 502.

FIG. 6 illustrates that a portion of a surface of the pad 107*a* is exposed by the opening 170*ab* of the passivation layer 105. The portion of the surface of the pad 107*a* that is exposed by the opening 170*ab* of the passivation layer 105 may be free of any direct contact with a solder interconnect and/or other interconnects. Moreover, a portion of a surface of the pad 107*b* is exposed by the opening 170*bb* of the passivation layer 105. The portion of the surface of the pad 107*b* that is exposed by the opening 170*bb* of the passivation layer 105 may be free of any direct contact with a solder interconnect and/or other interconnect. In addition, a portion of a surface of the pad 119*a* is exposed by the opening 170*d* of the passivation layer 105. The portion of the surface of the pad 119*a* that is exposed by the opening 170*d* of the passivation layer 105 may be free of any direct contact with a solder interconnect and/or other interconnect. However, it is noted there may be an underfill and/or a mold (both not shown) between the integrated device 100 and the substrate 502. Such an underfill and/or a mold may come into contact (e.g., may touch) the pad 107*a*, the pad 107*b* and/or the pad 119*a* through openings in the passivation layer 105.

It is noted that instead of a substrate, the integrated device 100 may be coupled to a board (e.g., printed circuit board) through the plurality of solder interconnects 310 and the plurality of solder interconnects 312.

Figure 7:
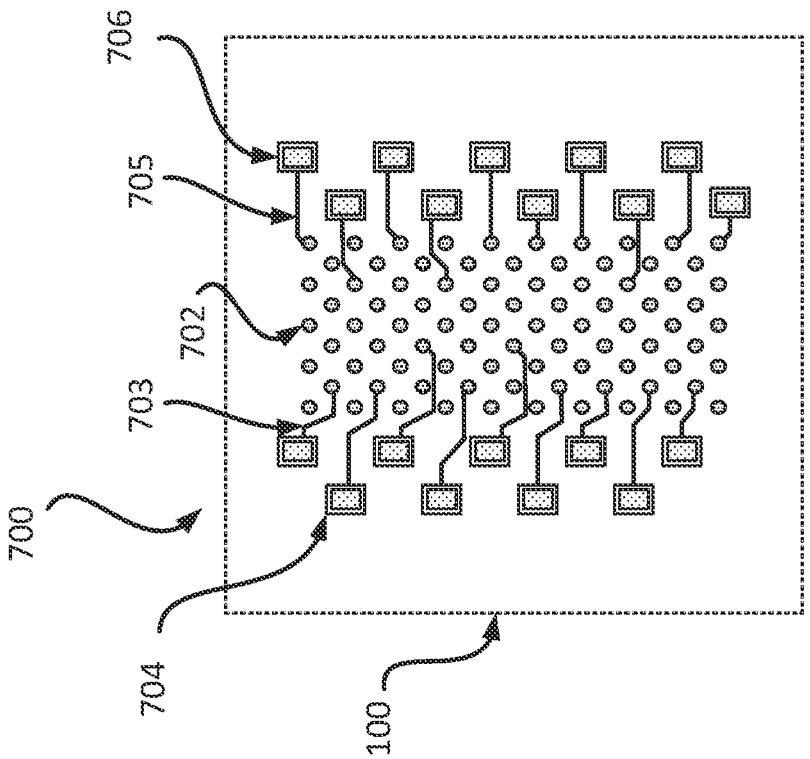
FIG. 7 illustrates a plan view of a portion of an exemplary integrated device that includes elongated pads.

FIG. 7 illustrates a plan view of a portion of an integrated device 100. The integrated device 100 includes a plurality of interconnects 700. The plurality of interconnects 700 may include a plurality of pads 702, a plurality of pads 704, a plurality of pads 706, a plurality of traces 703 and a plurality of traces 705. The plurality of interconnects 700 may be located along a periphery of the integrated device 100. The plurality of interconnects 700 may be located in a core portion of the integrated device 100. The plurality of pads 702 may represent core pads. The plurality of pads 702 may represent periphery pads (e.g., pads located along an edge of the integrated device). The plurality of pads 702 may be configured to provide at least one electrical path for power. The plurality of pads 702 may be configured to provide at least one electrical path for input/output signals. The plurality of pads 702 may have smaller width and/or a diameter than the plurality of pads 704 and/or the plurality of pads 706. The plurality of pads 702 may have smaller pitches than the plurality of pads 704 and/or the plurality of pads 706. The plurality of pads 702 may be configured to be coupled to a substrate and/or a board through a plurality of solder interconnects. In some implementations, the plurality of traces 703 and/or the plurality of traces 705 may be located on the same metal layer as the plurality of pads 702, the plurality of pads 704 and/or the plurality of pads 706. In some implementations, the plurality of traces 703 and/or the plurality of traces 705 may be located on a different metal layer than the plurality of pads 702, the plurality of pads 704 and/or the plurality of pads 706.

Figure 8:
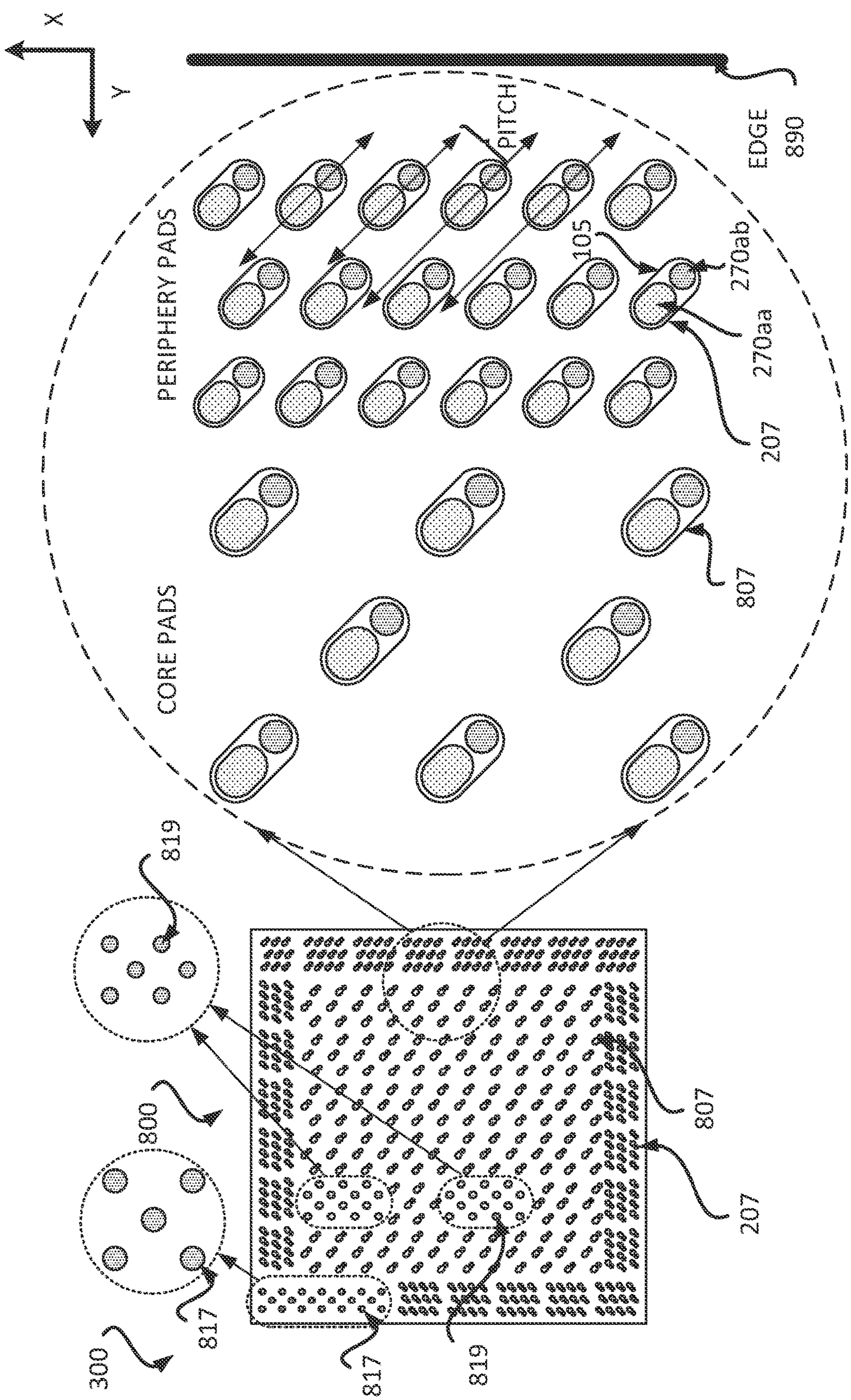
FIG. 8 illustrates a plan view of an exemplary integrated device that includes elongated pads.

The plurality of pads 704 and the plurality of pads 706 may be testing pads and/or landing pads. In some implementations, one or more testing probes may be configured to touch the plurality of pads 704 and/or the plurality of pads 706 in order to test the connectivity and/or the performance of one or more pads from the plurality of pads 702. The plurality of pads 704 may be configured to be electrically coupled to one or more pads from the plurality of pads 702 through the plurality of traces 703. The plurality of pads 706 may be configured to be electrically coupled to one or more pads from the plurality of pads 702 through the plurality of traces 705. By touching the plurality of pads 704 and/or the plurality of pads 706, one or more probes may be able to test the connectivity of the plurality of pads 702, since the plurality of pads 704 and/or the plurality of pads 706 are configured to be electrically coupled to the plurality of pads 702 through the plurality of traces 703 and/or the plurality of traces 705. FIG. 8 illustrates examples of where the plurality of pads 702, the plurality of pads 704 and/or the plurality of pads 706 may be located in an integrated device.

FIG. 8 illustrates a plan view of the integrated device 300 through an AA cross section. The integrated device 300 includes a plurality of pads 800. The plurality of pads 800 include the plurality of pads 207 (e.g., first plurality of pads), a plurality of pads 807 (e.g., second plurality of pads), a plurality of pads 817 and a plurality of pads 819. The plurality of pads 207 may be configured to provide at least one electrical path for signals (e.g., input/output (I/O) signals) for the integrated device 300. The plurality of pads 807 may be configured to provide at least one electrical path for power for the integrated device 300. In some implementations, one or more pads from the plurality of pads 800 may be configured to provide an electrical path for ground. One or more pads from the plurality of pads 800 may be a plurality of bump pads. In some implementations, a plurality of pillar interconnects may be coupled to at least some pads from the plurality of pads 800, as illustrated and described in at least FIG. 3. It is noted that for the purpose of clarity, other interconnects, such as traces coupled to the pads are not shown. Similarly, for the purpose of clarity, pillar interconnects are not shown in FIG. 8.

The plurality of pads 207 may be located along a periphery of the integrated device 300. For example, one or more rows (and/or one or more columns) of pads from the plurality of pads 207 may be located near and/or along one or more edges of the integrated device 300. The plurality of pads 207 may be located adjacent to an edge 890 of the integrated device 300. The plurality of pads 207 may include elongated pads. The plurality of pads 207 may include pads that have an oval shape (e.g., oblong shape). In some implementations, the plurality of pads 207 may have a minimum pitch (e.g., inline pitch) of about 80-90 micrometers. The plurality of pads 207 are arranged, configured, and/or aligned in such a way that a length of one or more pads from the plurality of pads 207 is aligned in a diagonal direction relative to one or more edges of the integrated device 300. This arrangement, alignment and/or configuration provides for more compact interconnects, pads with finer pitches, while still allowing testing probes to touch the interconnects so that the integrated device 300 can be tested. The plurality of pads 207 may laterally surround the plurality of pads 807. The plurality of pads 207 may include periphery pads.

The plurality of pads 807 may be similar to the plurality of pads 207. The plurality of pads 807 may be core pads. The plurality of pads 807 may be configured to provide one or more electrical paths for power. The plurality of pads 807 may be configured to provide one or more electrical paths for ground. Thus, in one example some of the pads from the plurality of pads 807 may be configured to provide one or more electrical paths for power, and some of the pads from the plurality of pads 807 may be configured to provide one or more electrical paths for ground. The plurality of pads 807 may have similar designs in the openings in the passivation layer as designs in the passivation layer for the plurality of pads 207. The plurality of pads 807 may have features that are larger (e.g., longer width, larger size, larger diameter, bigger opening) than the features of the plurality of pads 207.

FIG. 8 also illustrates the plurality of pads 817 and the plurality of pads 819. The plurality of pads 817 may be periphery pads. The plurality of pads 817 may be configured to provide one or more electrical paths for input/output signals. The plurality of pads 819 may be core pads. The plurality of pads 819 may be configured to provide one or more electrical paths for power. The plurality of pads 819 may be configured to provide one or more electrical paths for ground. The plurality of pads 817 may illustrate an example of locations for the plurality of pads 702 of FIG. 7. The plurality of pads 819 may illustrate an example of locations for the plurality of pads 702 of FIG. 7. The plurality of pads 819 may correspond to the plurality of pads 109. In some implementations, one or more of pads from the plurality of pads 817 may be coupled to a plurality of pads 704 (not shown in FIG. 8) through traces, in a similar manner as described in FIG. 7. In some implementations, one or more of pads from the plurality of pads 817 may be coupled to a plurality of pads 706 (not shown in FIG. 8) through traces, in a similar manner as described in FIG. 7. In some implementations, one or more of pads from the plurality of pads 819 may be coupled to a plurality of pads 704 (not shown in FIG. 8) through traces, in a similar manner as described in FIG. 7. In some implementations, one or more of pads from the plurality of pads 819 may be coupled to a plurality of pads 706 (not shown in FIG. 8) through traces, in a similar manner as described in FIG. 7. In some implementations, not all pads have a corresponding testing pads.

Figure 9:
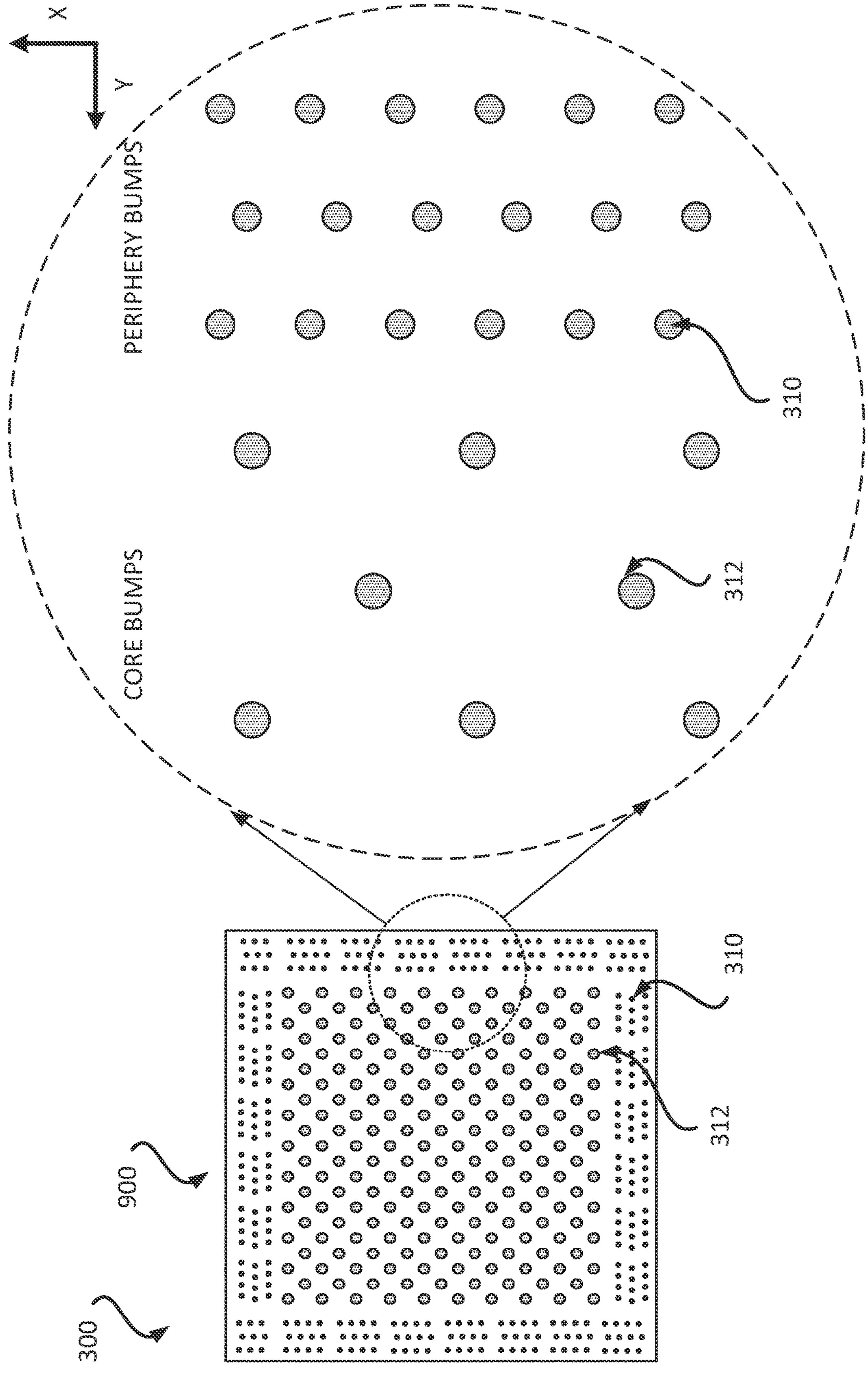
FIG. 9 illustrates a plan view of an exemplary integrated device that includes bumps.

FIG. 9 illustrates a plan view of the integrated device 300 through a BB cross section. The integrated device 300 includes a plurality of solder interconnects 900. The plurality of solder interconnects 900 may be bumps for the integrated device 300. The plurality of solder interconnects 900 include the plurality of solder interconnects 310 (e.g., first plurality of solder interconnects) and the plurality of solder interconnects 312 (e.g., second plurality of solder interconnects). The plurality of solder interconnects 312 may be core bumps (e.g., core solder interconnects). The plurality of solder interconnects 310 may be periphery bumps (e.g., periphery solder interconnects). The plurality of solder interconnects 310 may be configured to provide at least one electrical path for signals (e.g., input/output (I/O) signals) for the integrated device 300. The plurality of solder interconnects 312 may be configured to provide at least one electrical path for power for the integrated device 300. The plurality of solder interconnects 312 may be configured to be coupled to the plurality of pads 807 and/or the plurality of pads 819. The plurality of solder interconnects 310 may be configured to be coupled to the plurality of pads 207 and/or the plurality of pads 817. In some implementations, one or more solder interconnects from the plurality of solder interconnects 900 may be configured to provide an electrical path for ground. The plurality of solder interconnects 900 may be coupled to a plurality of pillar interconnects, as illustrated and described in at least FIG. 3. In some implementations, a plurality of pillar interconnects may be coupled to the plurality of pads 800, as illustrated and described in at least FIG. 8. In some implementations, the plurality of solder interconnects 900 may be coupled to a plurality of pads, as illustrated and described in at least FIG. 6. It is noted that for the purpose of clarity, other interconnects, such as traces coupled to the pads are not shown. Similarly, for the purpose of clarity, pillar interconnects are not shown in FIG. 9.

The plurality of solder interconnects 310 may be located along a periphery of the integrated device 300. For example, one or more rows (and/or one or more columns) of pads from the plurality of solder interconnects 310 may be located near and/or along one or more edges of the integrated device 300. In some implementations, the plurality of solder interconnects 310 may have a minimum pitch (e.g., inline pitch) of about 80-90 micrometers. The plurality of solder interconnects 310 may laterally surround the plurality of solder interconnects 312.

Figure 10:
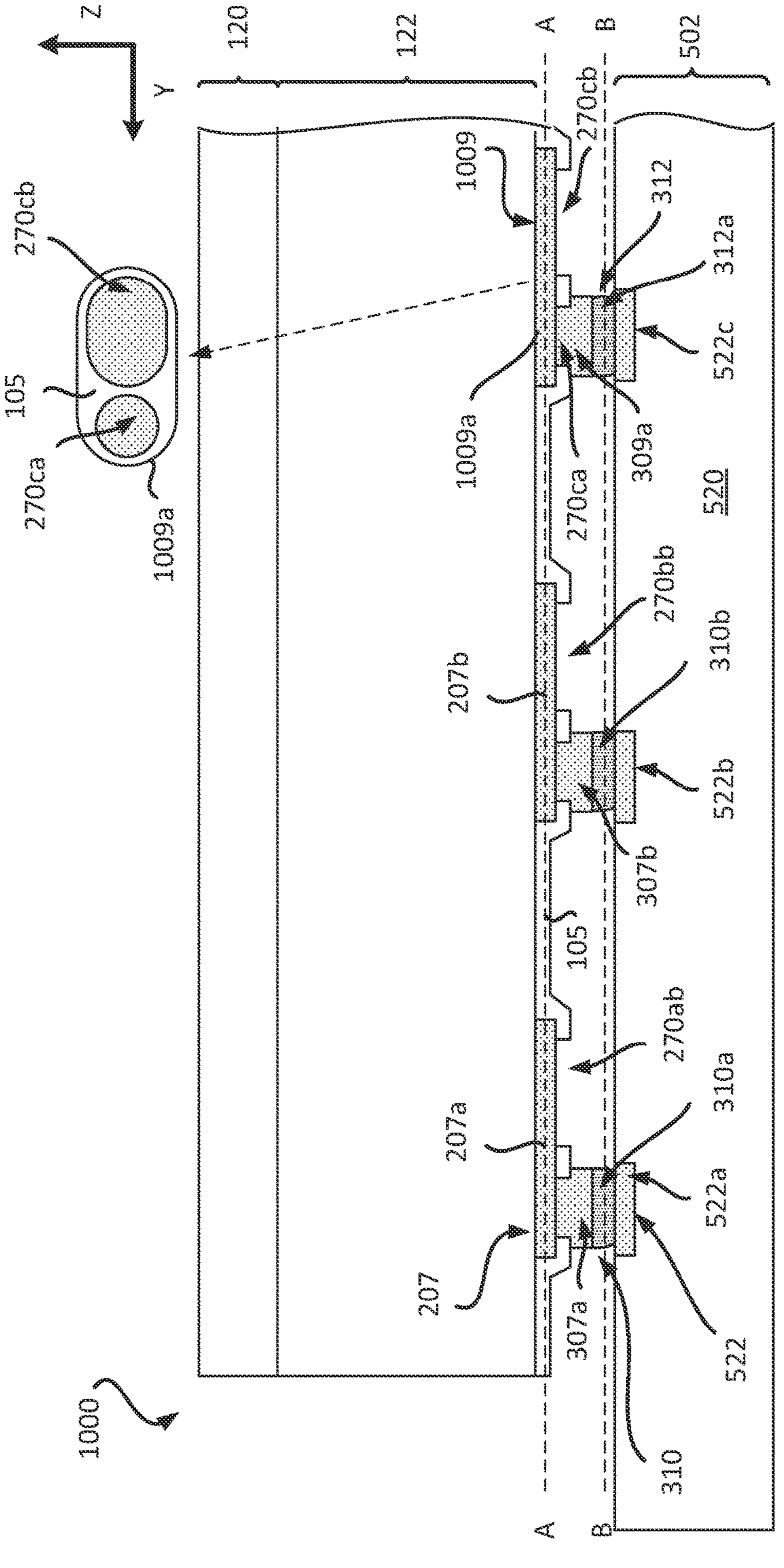
FIG. 10 illustrates a cross sectional profile view of an exemplary integrated device that includes elongated pads, where the integrated device is coupled to a substrate.

FIG. 10 illustrates an integrated device 1000 that is coupled to the substrate 502. The integrated device 1000 is similar to the integrated device 300, and thus include similar components as the integrated device 300. The integrated device 1000 includes the die substrate 120, the interconnect portion 122, the passivation layer 105, the plurality of pads 207, a plurality of pads 1009, a plurality of pillar interconnects 307, a plurality of pillar interconnects 309, a plurality of solder interconnects 310 and a plurality of solder interconnects 312. The plurality of pillar interconnects 307 include a pillar interconnect 307*a* and a pillar interconnect 307*b*. The plurality of pillar interconnects 309 include a pillar interconnect 309*a*. The plurality of solder interconnects 310 include a solder interconnect 310*a* and a solder interconnect 310*b*. The plurality of solder interconnects 312 include a solder interconnect 312*a*.

The plurality of pads 1009 may include elongated pads. The plurality of pads 1009 may include a pad 1009*a*. The plurality of pads 1009 may be configured to provide at least one electrical path for power. The plurality of pads 1009 may include pads that have an oval shape (e.g., oblong shape). There is an opening 270*ca* and an opening 270*cb* in the passivation layer 105. The opening 270*ca* and the opening 270*cb* may each expose a portion of a surface of the pad 1009*a*. The pillar interconnect 309*a* may be coupled to the pad 1009*a* through the opening 270*ca* of the passivation layer 105. A portion of a surface of the pad 1009*a* is exposed by the opening 270*cb* of the passivation layer 105. The portion of the surface of the pad 1009*a* that is exposed by the opening 270*cb* of the passivation layer 105 may be free of any direct contact with a solder interconnect and/or other interconnects. However, it is noted there may be an underfill and/or a mold (both not shown) between the integrated device 1000 and the substrate 502. Such an underfill and/or a mold may come into contact (e.g., may touch) the pad 1009*a* through openings in the passivation layer 105.

The substrate 502 includes at least one dielectric layer 520 and a plurality of interconnects 522 (e.g., substrate interconnects). The integrated device 1000 is coupled to the substrate 502 through the plurality of solder interconnects 310 (e.g., first plurality of solder interconnects) and the plurality of solder interconnects 312 (e.g., second plurality of solder interconnects). The integrated device 1000 is coupled to the plurality of interconnects 522 of the substrate 502 through the plurality of solder interconnects 310 and the plurality of solder interconnects 312. The pillar interconnect 307*a* is coupled to the solder interconnect 310*a*. The solder interconnect 310*a* is coupled to the interconnect 522*a* of the substrate 502. The pillar interconnect 307*b* is coupled to the solder interconnect 310*b*. The solder interconnect 310*b* is coupled to the interconnect 522*b* of the substrate 502. The pillar interconnect 309*a* is coupled to the solder interconnect 312*a*. The solder interconnect 312*a* is coupled to the interconnect 522*c* of the substrate 502.

It is noted that instead of a substrate, the integrated device 1000 may be coupled to a board (e.g., printed circuit board) through the plurality of solder interconnects 310 and the plurality of solder interconnects 312.

Figure 11:
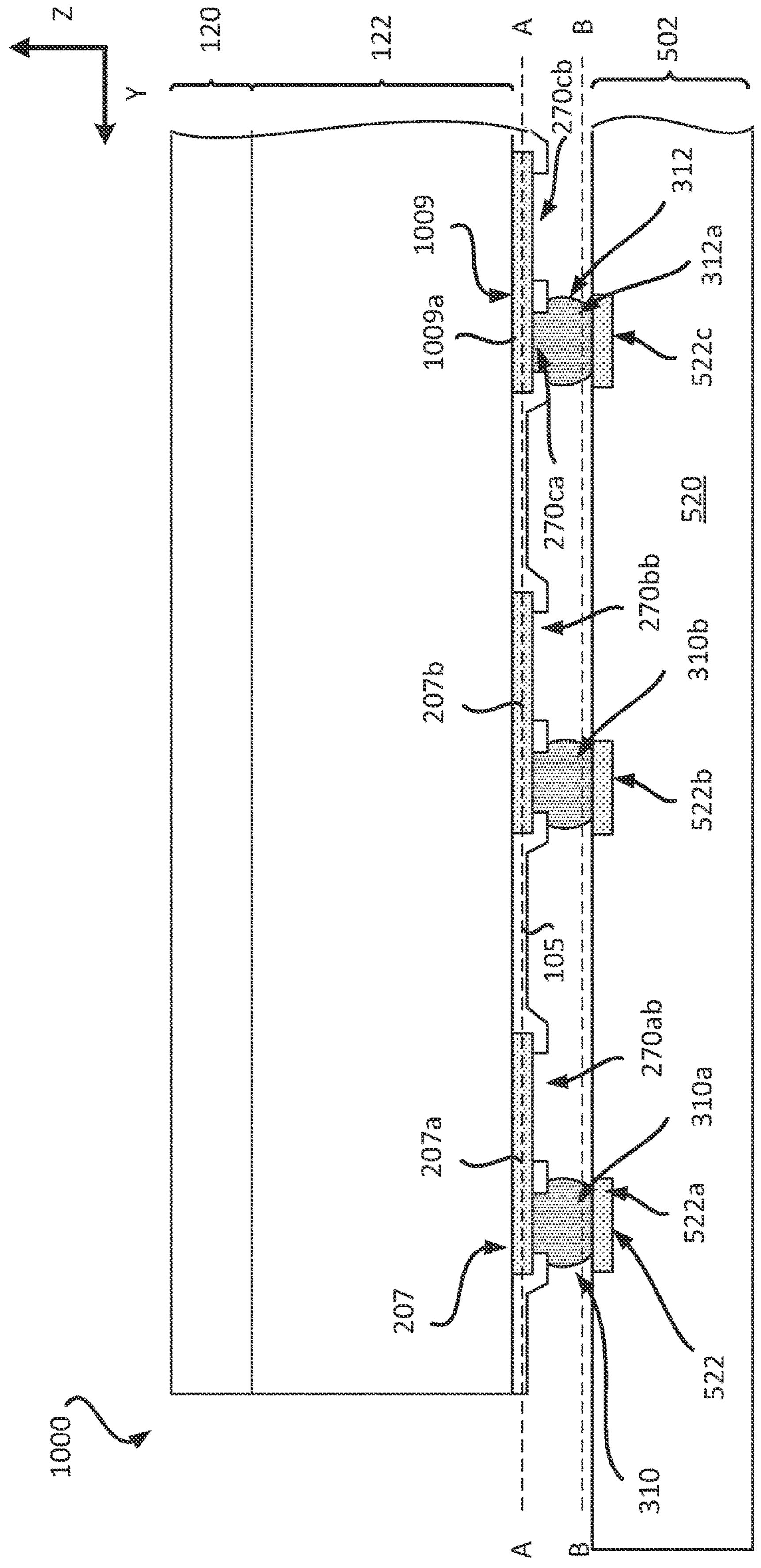
FIG. 11 illustrates a cross sectional profile view of an exemplary integrated device that includes elongated pads, where the integrated device is coupled to a substrate.

FIG. 11 illustrates the integrated device 1000 that is coupled to the substrate 502. The substrate 502 includes at least one dielectric layer 520 and a plurality of interconnects 522 (e.g., substrate interconnects). The integrated device 1000 is coupled to the substrate 502 through the plurality of solder interconnects 310 (e.g., first plurality of solder interconnects) and the plurality of solder interconnects 312 (e.g., second plurality of solder interconnects). The integrated device 1000 is coupled to the plurality of interconnects 522 of the substrate 502 through the plurality of solder interconnects 310 and the plurality of solder interconnects 312. The pad 207*a* is coupled to the solder interconnect 310*a*. The solder interconnect 310*a* is coupled to the interconnect 522*a* of the substrate 502. The pad 207*b* is coupled to the solder interconnect 310*b*. The solder interconnect 310*b* is coupled to the interconnect 522*b* of the substrate 502. The pad 1009*a* is coupled to the solder interconnect 312*a*. The solder interconnect 312*a* is coupled to the interconnect 522*c* of the substrate 502.

FIG. 11 illustrates that a portion of a surface of the pad 1009*a* is exposed by the opening 270*cb* of the passivation layer 105. The portion of the surface of the pad 1009*a* that is exposed by the opening 270*cb* of the passivation layer 105 may be free of any direct contact with a solder interconnect and/or other interconnects. However, it is noted there may be an underfill and/or a mold (both not shown) between the integrated device 1000 and the substrate 502. Such an underfill and/or a mold may come into contact (e.g., may touch) the pad 1009*a* through openings in the passivation layer 105.

It is noted that instead of a substrate, the integrated device 1000 may be coupled to a board (e.g., printed circuit board) through the plurality of solder interconnects 310 and the plurality of solder interconnects 312.

Figure 12:
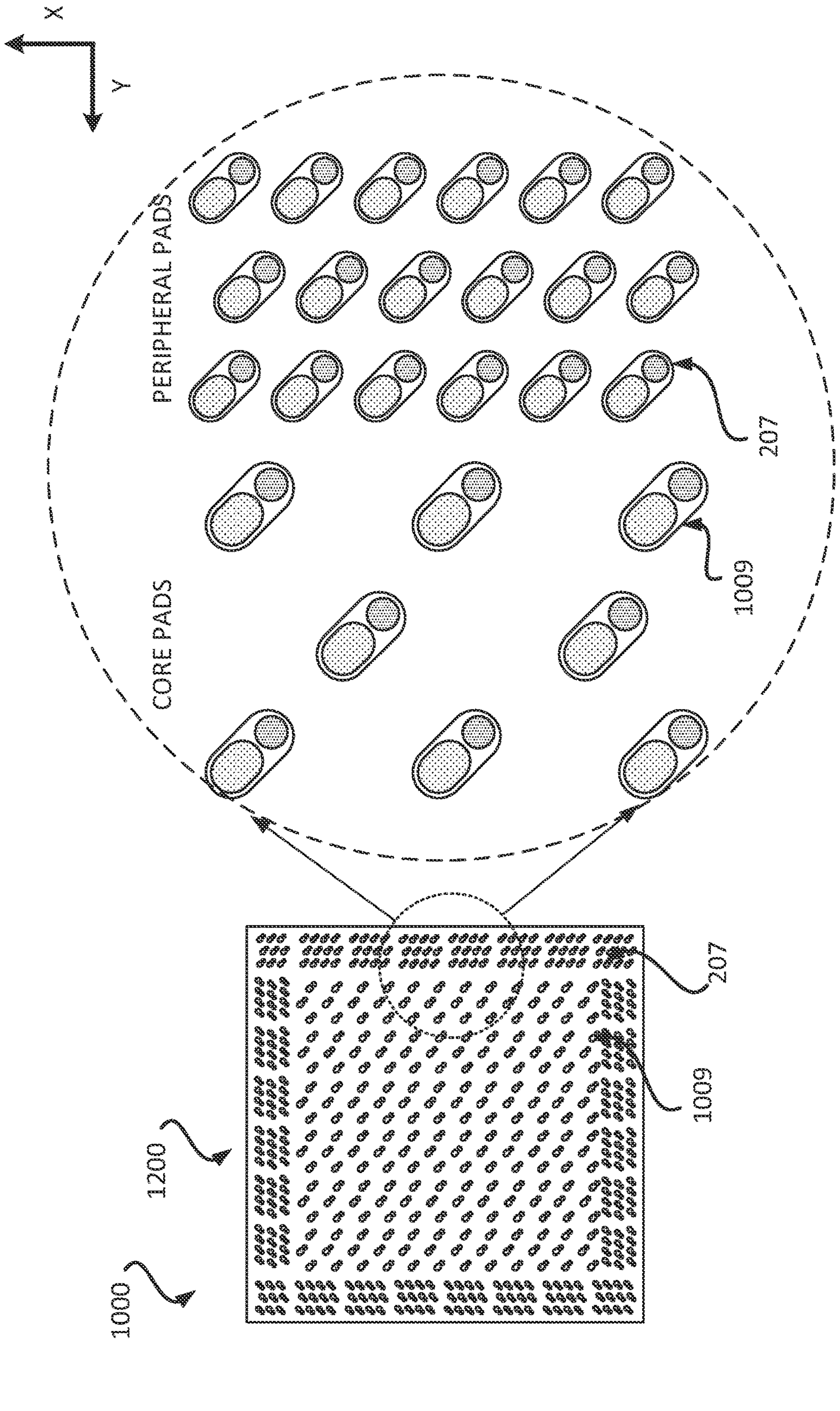
FIG. 12 illustrates a plan view of an exemplary integrated device that includes elongated pads.

FIG. 12 illustrates a plan view of the integrated device 1000 through an AA cross section. The integrated device 1000 includes a plurality of pads 1200. The plurality of pads 1200 include the plurality of pads 207 (e.g., first plurality of pads) and the plurality of pads 1009 (e.g., second plurality of pads). The plurality of pads 207 may be configured to provide at least one electrical path for signals (e.g., input/output (I/O) signals) for the integrated device 1000. The plurality of pads 1009 may be configured to provide at least one electrical path for power for the integrated device 1000. In some implementations, one or more pads from the plurality of pads 1200 may be configured to provide an electrical path for ground. The plurality of pads 1200 may be a plurality of bump pads. In some implementations, a plurality of pillar interconnects may be coupled to the plurality of pads 1200, as illustrated and described in at least FIGS. 3 and 10. It is noted that for the purpose of clarity, other interconnects, such as traces coupled to the pads are not shown. Similarly, for the purpose of clarity, pillar interconnects are not shown in FIG. 12.

The plurality of pads 207 may be located along a periphery of the integrated device 1000. For example, one or more rows (and/or one or more columns) of pads from the plurality of pads 207 may be located near and/or along one or more edges of the integrated device 1000. The plurality of pads 207 may include elongated pads. The plurality of pads 207 may include pads that have an oval shape (e.g., oblong shape). In some implementations, the plurality of pads 207 may have a minimum pitch (e.g., inline pitch) of about 80-90 micrometers. A more detailed description of an inline pitch was illustrated and described in at least FIG. 8. The plurality of pads 207 are arranged, configured, and/or aligned in such a way that a length of one or more pads from the plurality of pads 207 are aligned in a diagonal direction relative to one or more edges of the integrated device 1000. The plurality of pads 207 may laterally surround the plurality of pads 1009. The plurality of pads 1009 may include pads that have an oval shape (e.g., oblong shape). The plurality of pads 1009 are arranged, configured, and/or aligned in such a way that a length of one or more pads from the plurality of pads 1009 are aligned in a diagonal direction relative to one or more edges of the integrated device 1000. However, the plurality of pads 1009 may be aligned in different directions and/or different combinations of different directions. In some implementations, the plurality of pads 1009 may be used in combination with the plurality of pads 109. It is noted that a plurality of pads that are described in the disclosure as configured to provide at least one electrical path for power for the integrated device may be configured to provide electrical paths for multiple power sources and/or power resources. For example, a plurality of pads configured to provide at least one electrical path for power for the integrated device may include to mean (i) a first plurality of pads configured to provide at least first electrical path for a first power and (ii) a second plurality of pads configured to provide at least second electrical path for a second power.

An integrated device (e.g., 100, 200, 300, 1000) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 100, 200, 300, 1000) may include at least one electronic circuit (e.g., first electronic circuit, second electronic circuit, etc. . . . ). An integrated device may be an example of an electrical component and/or electrical device. In some implementations, an integrated device may be a chiplet. A chiplet may be fabricated using one or more processes that provides better yields compared to other processes used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). Using several chiplets that perform several functions may reduce the overall cost of a package relative to using a single chip to perform all of the functions of a package.

Having described an integrated device with elongated pads, a method for fabricating an integrated device will now be described below.

Figure 13:
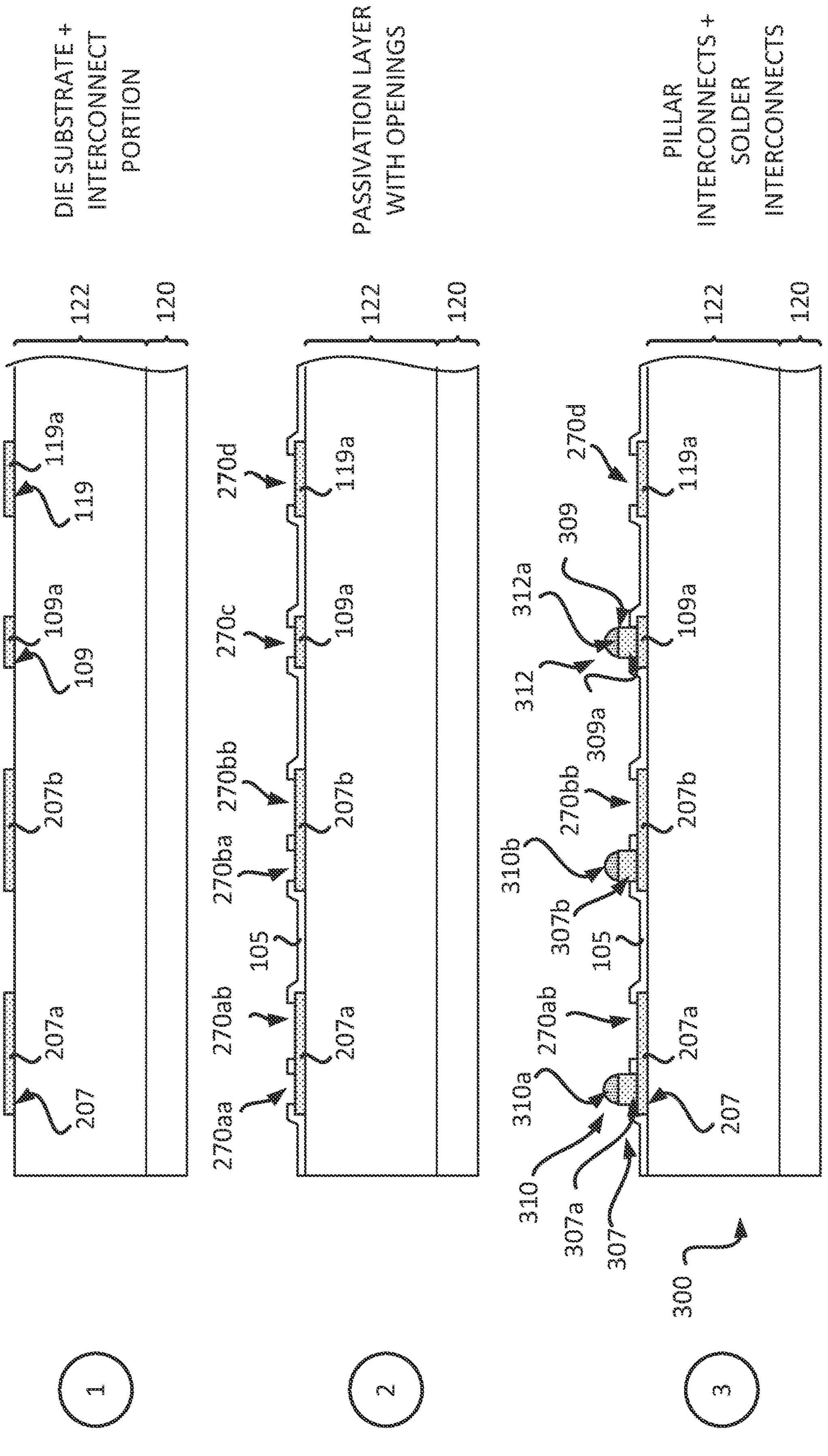
FIG. 13 illustrates an exemplary sequence for fabricating an exemplary integrated device that includes elongated pads.

Exemplary Sequence for Fabricating an Integrated Device Comprising Elongated Pads In some implementations, fabricating an integrated device includes several processes. FIG. 13 illustrates an exemplary sequence for providing or fabricating an integrated device. In some implementations, the sequence of FIG. 13 may be used to provide or fabricate the integrated device 300 of FIG. 3. However, the process of FIG. 13 may be used to fabricate any of the integrated devices described in the disclosure.

It should be noted that the sequence of FIG. 13 may combine one or more stages in order to simplify and/or clarify the sequence for providing or fabricating an integrated device. In some implementations, the order of the processes may be changed or modified. In some implementations, one or more of processes may be replaced or substituted without departing from the scope of the disclosure.

Stage 1, as shown in FIG. 13, illustrates a state after a die substrate 120, an interconnect portion 122, a plurality of pads 207, a plurality of pads 109 and a plurality of pads 119 are provided. The plurality of pads 119 may be testing pads. The die portion 102 may include a bare die (e.g., semiconductor bare die). Providing the die substrate 120, the interconnect portion 122, the plurality of pads 207, the plurality of pads 109 and the plurality of pads 119 may include fabricating the die substrate 120, the interconnect portion 122, the plurality of pads 207, the plurality of pads 109 and the plurality of pads 119. The plurality of pads 207, the plurality of pads 109 and/or the plurality of pads 119 may be considered part of the interconnect portion 122. For example, the plurality of pads 207, the plurality of pads 109 and/or the plurality of pads 119 may be considered part of die interconnects of the interconnect portion 122. The die substrate 120, the interconnect portion 122, the plurality of pads 207, the plurality of pads 109 and the plurality of pads 119 may be fabricated using FEOL and BEOL fabrication processes. The plurality of pads 207, the plurality of pads 109 and/or the plurality of pads 119 may include elongated pads (e.g., pads with rectangular shapes, pads with oval shapes, pads with oblong shapes).

Stage 2 illustrates a state after a passivation layer 105 is formed over the interconnect portion 122, the plurality of pads 207 and/or the plurality of pads 109. A deposition, a lamination, an exposure, a development and/or an etching process may be used to form and pattern the passivation layer 105. The passivation layer 105 includes a plurality of openings 270, as described in at least FIGS. 2 and 3. For example, the passivation layer 105 may include the opening 270*aa*, the opening 270*ab*, the opening 270*ba*, the opening 270*bb*, the opening 270*c* and the opening 270*d*. The passivation layer 105 may be considered part of the interconnect portion 122.

Stage 3 illustrates a state after a plurality of pillar interconnects 307 and a plurality of pillar interconnects 309 are formed. The plurality of pillar interconnects 307 may be coupled to the plurality of pads 207. The plurality of pillar interconnects 309 may be coupled to the plurality of pads 109. One or more plating processes and patterning processes may be used to form the plurality of pillar interconnects 307 and/or the plurality of pillar interconnects 309.

Stage 3 also illustrates a state after a plurality of solder interconnects 310 and a plurality of solder interconnects 312 are provided. The plurality of solder interconnects 310 may be coupled to the plurality of pillar interconnects 307. The plurality of solder interconnects 312 may be coupled to the plurality of pillar interconnects 309. One or more solder reflow processes may be used to form the plurality of solder interconnects 310 and/or the plurality of solder interconnects 312. Stage 3 may illustrate an integrated device 300 that includes elongated pads.

In some implementations, an integrated device may not include a plurality of pillar interconnects. In such instances, the plurality of solder interconnects (e.g., 310, 312) may be formed such that the plurality of solder interconnects are coupled to the plurality of pads (e.g., 107, 207, 109).

Figure 14:
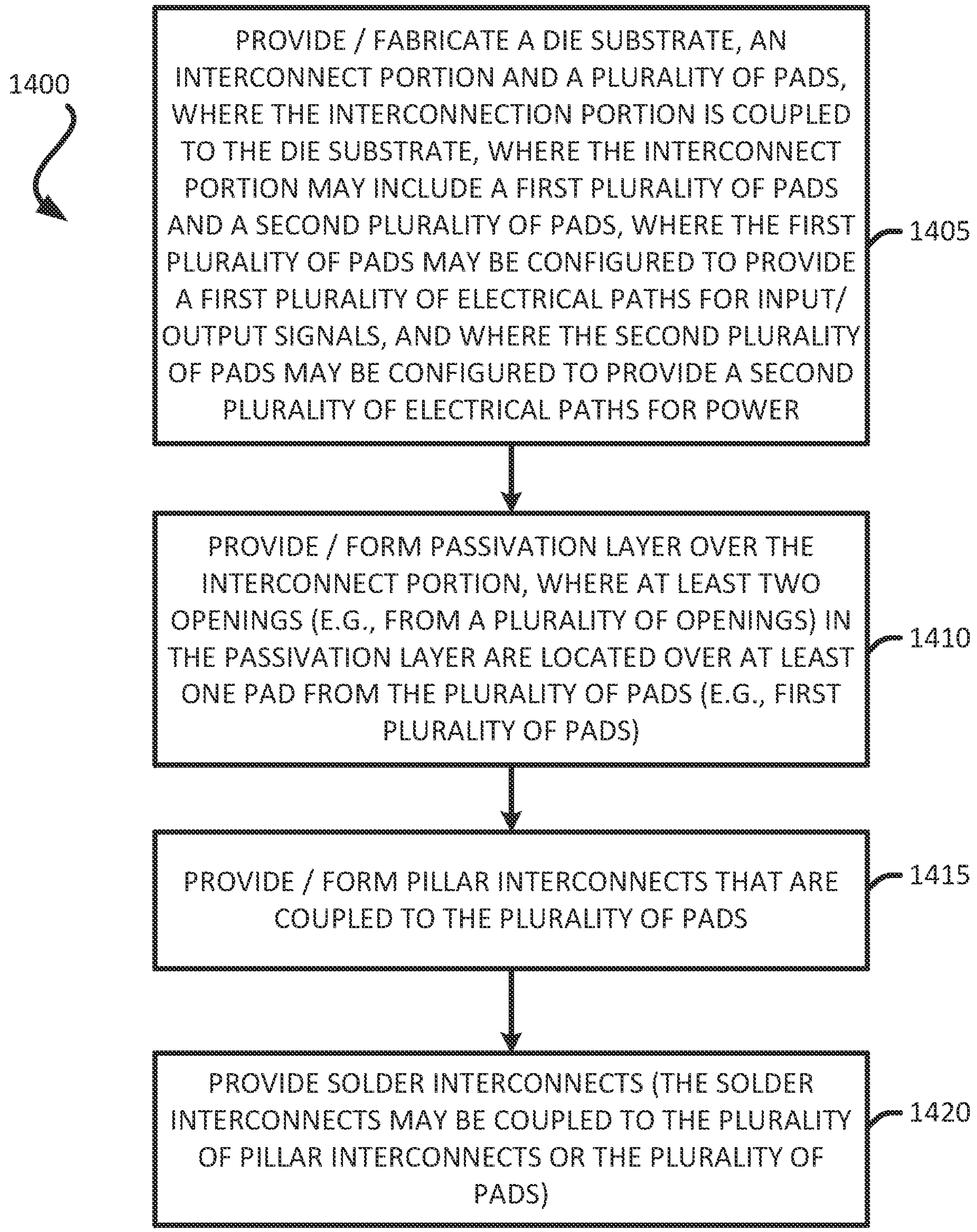
FIG. 14 illustrates an exemplary flow diagram of a method for fabricating an exemplary integrated device that includes elongated pads use.

Exemplary Flow Diagram of a Method for Fabricating an Integrated Device Comprising Elongated Pads In some implementations, fabricating an integrated device includes several processes. FIG. 14 illustrates an exemplary flow diagram of a method 1400 for providing or fabricating an integrated device. In some implementations, the method 1400 of FIG. 14 may be used to provide or fabricate the integrated device 300 of FIG. 3 described in the disclosure. However, the method 1400 may be used to provide or fabricate any of the integrated devices described in the disclosure.

It should be noted that the method of FIG. 14 may combine one or more processes in order to simplify and/or clarify the method for providing or fabricating an integrated device. In some implementations, the order of the processes may be changed or modified.

The method provides (at 1405) a die substrate, an interconnect portion, and a plurality of pads. Stage 1 of FIG. 13, illustrates and describes an example of a die substrate 120, an interconnect portion 122, a plurality of pads 207, a plurality of pads 109 and a plurality of pads 119 that are provided. The die portion 102 may include a bare die (e.g., semiconductor bare die). Providing the die substrate 120, the interconnect portion 122, the plurality of pads 207, the plurality of pads 109 and/or the plurality of pads 119 may include forming and/or fabricating the die substrate 120, the interconnect portion 122, the plurality of pads 207, the plurality of pads 109 and/or the plurality of pads 119. The plurality of pads 207, the plurality of pads 109 and/or the plurality of pads 119 may be considered part of the interconnect portion 122. The die substrate 120, the interconnect portion 122, the plurality of pads 207, the plurality of pads 109 and/or the plurality of pads 119 may be fabricated using FEOL and BEOL fabrication processes. The plurality of pads 207, the plurality of pads 109 and/or the plurality of pads 119 may include elongated pads (e.g., pads with rectangular shapes, pads with oval shapes, pads with oblong shapes).

The method forms (at 1410) a passivation layer over the interconnect portion. The passivation layer may include a plurality of openings. Some of the openings may be located over a pad (e.g., elongated pad). In some implementations, two or more openings in the passivation layer may be located over a pad. Stage 2 of FIG. 13, illustrates and describes an example of a passivation layer 105 that is formed over the interconnect portion 122, the plurality of pads 207, the plurality of pads 109 and/or the plurality of pads 119. A deposition, a lamination, an exposure, a development and/or an etching process may be used to form and pattern the passivation layer 105. The passivation layer 105 may include a plurality of openings 270, as described in at least FIGS. 2 and 3. The passivation layer 105 may be considered part of the interconnect portion 122.

The method forms (at 1415) a plurality of pillar interconnects that are coupled to the plurality of pads. Stage 3 of FIG. 13, illustrates and describes an example of a plurality of pillar interconnects 307 and a plurality of pillar interconnects 309 that are formed. The plurality of pillar interconnects 307 may be coupled to the plurality of pads 207 through openings in the passivation layer 105. The plurality of pillar interconnects 309 may be coupled to the plurality of pads 109 through openings in the passivation layer 105. One or more plating processes and patterning processes may be used to form the plurality of pillar interconnects 307 and/or the plurality of pillar interconnects 309.

The method forms (at 1420) a plurality of solder interconnects that are coupled to the plurality of pillar interconnects. Stage 3 of FIG. 13, illustrates and describes an example of a plurality of solder interconnects 310 and a plurality of solder interconnects 312 that are formed. The plurality of solder interconnects 310 may be coupled to the plurality of pillar interconnects 307. The plurality of solder interconnects 312 may be coupled to the plurality of pillar interconnects 309. One or more solder reflow processes may be used to form the plurality of solder interconnects 310 and/or the plurality of solder interconnects 312.

In some implementations, there may not be a plurality of pillar interconnects. In such instances, the plurality of solder interconnects (e.g., 310, 312) may be formed such that the plurality of solder interconnects are coupled to the plurality of pads (e.g., 107, 207, 109).

Exemplary Electronic Devices

Figure 15:
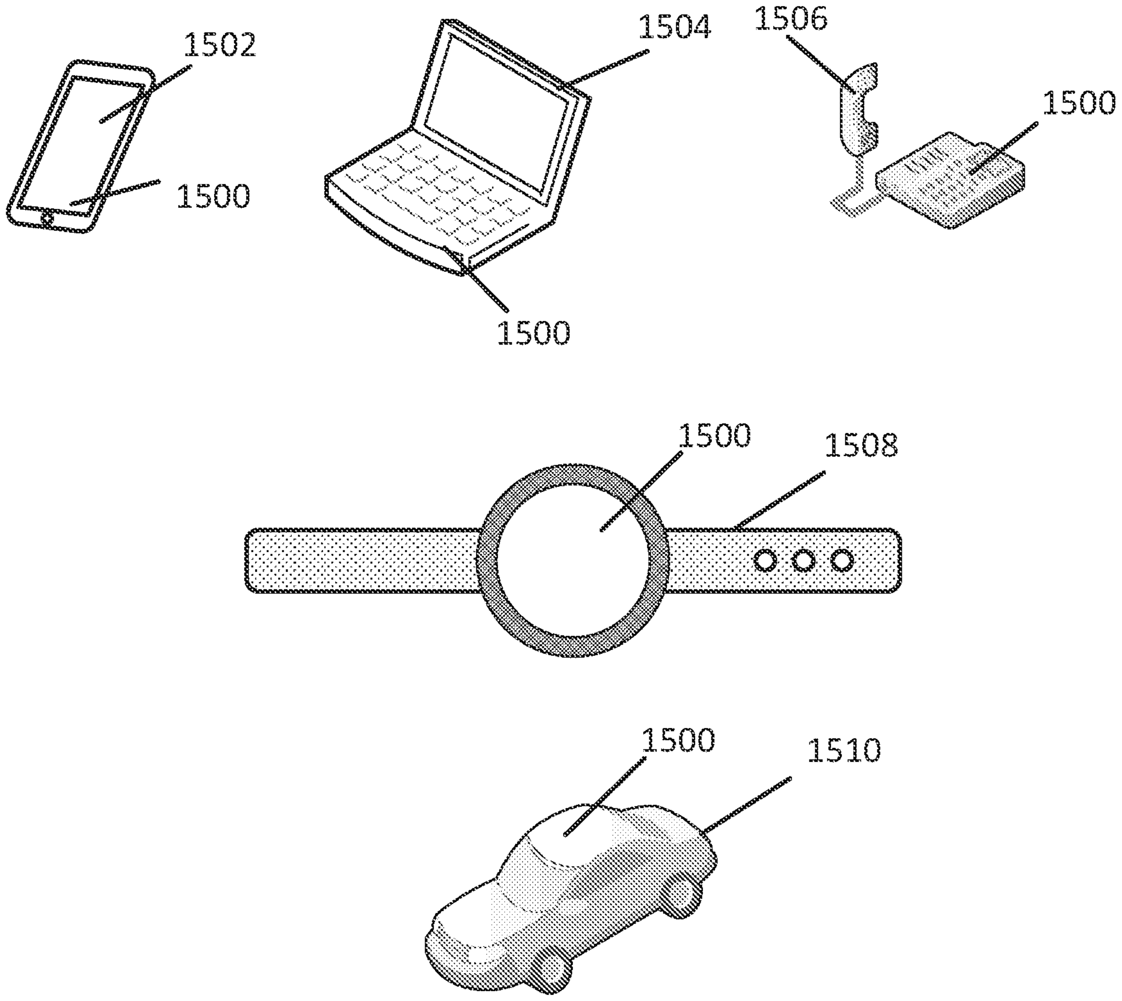
FIG. 15 illustrates various electronic devices that may integrate a die, an electronic circuit, an integrated device, an integrated passive device (IPD), a passive component, a package, and/or a device package described herein.

FIG. 15 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1502, a laptop computer device 1504, a fixed location terminal device 1506, a wearable device 1508, or automotive vehicle 1510 may include a device 1500 as described herein. The device 1500 may be, for example, any of the devices and/or integrated circuit (IC) packages described herein. The devices 1502, 1504, 1506 and 1508 and the vehicle 1510 illustrated in FIG. 15 are merely exemplary. Other electronic devices may also feature the device 1500 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-15 may be rearranged and/or combined into a single component, process, feature or function or embodied in several components, processes, or functions. Additional elements, components, processes, and/or functions may also be added without departing from the disclosure. It should also be noted FIGS. 1-15 and its corresponding description in the present disclosure is not limited to dies and/or ICs. In some implementations, FIGS. 1-15 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object A, that is coupled to an object B, may be coupled to at least part of object B. The term “electrically coupled” may mean that two objects are directly or indirectly coupled together such that an electrical current (e.g., signal, power, ground) may travel between the two objects. Two objects that are electrically coupled may or may not have an electrical current traveling between the two objects. The use of the terms “first”, “second”, “third” and “fourth” (and/or anything above fourth) is arbitrary. Any of the components described may be the first component, the second component, the third component or the fourth component. For example, a component that is referred to a second component, may be the first component, the second component, the third component or the fourth component. The terms “encapsulate”, “encapsulating” and/or any derivation means that the object may partially encapsulate or completely encapsulate another object. The terms “top” and “bottom” are arbitrary. A component that is located on top may be located over a component that is located on a bottom. A top component may be considered a bottom component, and vice versa. As described in the disclosure, a first component that is located “over” a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term “over” as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located “in” a second component may be partially located in the second component or completely located in the second component. A value that is about X-XX, may mean a value that is between X and XX, inclusive of X and XX. The value(s) between X and XX may be discrete or continuous. The term “about ‘value X’”, or “approximately value X”, as used in the disclosure means within 10 percent of the ‘value X’. For example, a value of about 1 or approximately 1, would mean a value in a range of 0.9-1.1. A “plurality” of components may include all the possible components or only some of the components from all of the possible components. For example, if a device includes ten components, the use of the term “the plurality of components” may refer to all ten components or only some of the components from the ten components.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

Aspect 1: A device comprising an integrated device. The integrated device comprises a die substrate; an interconnect portion coupled to the die substrate; a passivation layer coupled to the interconnect portion and a plurality of pillar interconnects. The interconnect portion includes a first plurality of pads and a second plurality of pads. The first plurality of pads are configured to provide a first plurality of electrical paths for input/output signals. The second plurality of pads are configured to provide a second plurality of electrical paths for power. The passivation layer comprises a plurality of openings. The plurality of openings include at least one opening located over a pad from the first plurality of pads. The plurality of pillar interconnects are coupled to the first plurality of pads and the second plurality of pads.

Aspect 2: The device of aspect 1, wherein there is at least one opening in the passivation layer that is located over each pad from the first plurality of pads.

Aspect 3: The device of aspects 1 through 2, wherein the integrated device further comprises a plurality of solder interconnects coupled to the plurality of pillar interconnects.

Aspect 4: The device of aspects 1 through 3, wherein each pad from the first plurality of pads includes a length that is aligned in a diagonal direction relative to an edge of the integrated device.

Aspect 5: The device of aspects 1 through 4, wherein the first plurality of pads are located along a periphery of the integrated device, and wherein the second plurality of pads are laterally surrounded by the first plurality of pads.

Aspect 6: The device of aspects 1 through 5, wherein at least one pad from the first plurality of pads has a rectangular shape, an oval shape or an oblong shape, and wherein a portion of a surface of a pad from the first plurality of pads is exposed through an opening in the passivation layer, is not touching a solder interconnect.

Aspect 7: The device of aspects 1 through 6, wherein at least one pad from the second plurality of pads has a rectangular shape, an oval shape or an oblong shape, and wherein a portion of a surface of a pad from the second plurality of pads is exposed through an opening in the passivation layer, is not touching a solder interconnect.

Aspect 8: The device of aspects 1 through 7, further comprising a substrate coupled to the integrated device through a plurality of solder interconnects, wherein the plurality of solder interconnects are coupled to the plurality of pillar interconnects.

Aspect 9: The device of aspects 1 through 7, further comprising a board coupled to the integrated device through a plurality of solder interconnects, wherein the plurality of solder interconnects are coupled to the plurality of pillar interconnects.

Aspect 10: The device of aspects 1 through 9, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 11: An integrated device comprising a die substrate; an interconnect portion coupled to the die substrate; and a passivation layer coupled to the interconnect portion. The interconnect portion includes a first plurality of pads and a second plurality of pads. The first plurality of pads are configured to provide a first plurality of electrical paths for input/output signals. The second plurality of pads are configured to provide a second plurality of electrical paths for power. The passivation layer comprises a plurality of openings. The plurality of openings include at least two openings located over a pad from the first plurality of pads.

Aspect 12: The integrated device of aspect 11, wherein there are at least two openings in the passivation layer that are located over each pad from the first plurality of pads.

Aspect 13: The integrated device of aspect 12, wherein there is one opening in the passivation layer that is located over each pad from the second plurality of pads.

Aspect 14: The integrated device of aspects 12 through 13, further comprising a plurality of solder interconnects coupled to the first plurality of pads and the second plurality of pads.

Aspect 15: The integrated device of aspect 14, wherein the plurality of solder interconnects include (i) a first plurality of solder interconnects coupled to the first plurality of pads, and (ii) a second plurality of solder interconnects coupled to the second plurality of pads.

Aspect 16: The integrated device of aspect 15, wherein the first plurality of solder interconnects are coupled to the first plurality of pads through one of the two openings in the passivation layer for each pad from the first plurality of pads.

Aspect 17: The integrated device of aspect 16, wherein for each pad from the first plurality of pads, a first portion of a surface of the pad not covered by the passivation layer is coupled to a solder interconnect, and a second portion of the surface of the pad not covered by the passivation layer is not touching solder interconnect.

Aspect 18: The integrated device of aspects 11 through 17, wherein each pad from the first plurality of pads include a length that is aligned in a diagonal direction relative to an edge of the integrated device.

Aspect 19: The integrated device of aspects 11 through 18, wherein the first plurality of pads are located along a periphery of the integrated device, and wherein the second plurality of pads are laterally surrounded by the first plurality of pads.

Aspect 20: The integrated device of aspects 11 through 19, wherein pads from the first plurality of pads have a different shape than pads from the second plurality of pads.

Aspect 21: A method for fabricating an integrated device. The method provides a die substrate. The method provides an interconnect portion that is coupled to the die substrate. The interconnect portion includes a first plurality of pads and a second plurality of pads. The first plurality of pads are configured to provide a first plurality of electrical paths for input/output signals. The second plurality of pads are configured to provide a second plurality of electrical paths for power. The method provides a passivation layer that is coupled to the interconnect portion. The passivation layer comprises a plurality of openings. The plurality of openings include at least two opening located over a pad from the first plurality of pads.

Aspect 22: The method of aspect 21, wherein there is at least one opening in the passivation layer that is located over each pad from the first plurality of pads.

Aspect 23: The method of aspects 21 through 22, further comprising: forming a plurality of pillar interconnects coupled to the first plurality of pads and the second plurality of pads; and forming a plurality of solder interconnects that are coupled to the plurality of pillar interconnects.

Aspect 24: The method of aspects 21 through 23, wherein each pad from the first plurality of pads includes a length that is aligned in a diagonal direction relative to an edge of the integrated device.

Aspect 25: The method of aspects 21 through 24, wherein the first plurality of pads are located along a periphery of the integrated device, and wherein the second plurality of pads are laterally surrounded by the first plurality of pads.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A device comprising:

an integrated device comprising:

a die substrate;

an interconnect portion coupled to the die substrate, wherein the interconnect portion includes a first plurality of pads and a second plurality of pads, wherein the first plurality of pads are configured to provide a first plurality of electrical paths for input/output signals, wherein the first plurality of pads include a first pad and a second pad, wherein the first pad includes a length and a width, where the length is greater than the width, wherein the second pad includes the length and the width, wherein the length of the first pad is aligned in a diagonal direction relative to a first edge of the integrated device, wherein the length of the second pad is aligned in a diagonal direction relative to the first edge of the integrated device, and wherein the second plurality of pads are configured to provide a second plurality of electrical paths for power;

a passivation layer coupled to the interconnect portion, wherein the passivation layer comprises a plurality of openings, and wherein the plurality of openings include at least one opening located over a pad from the first plurality of pads; and a plurality of pillar interconnects coupled to the first plurality of pads and the second plurality of pads.

2. The device of claim 1, wherein there is at least one opening in the passivation layer that is located over each pad from the first plurality of pads.

3. The device of claim 1, wherein the integrated device further comprises a plurality of solder interconnects coupled to the plurality of pillar interconnects.

4. The device of claim 1,
wherein a pad from the second plurality of pads includes another length and another width,
wherein the another length of the pad from the second plurality of pads is different from the length of the first pad and the second pad,
wherein the another width of the pad from the second plurality of pads is different from the width of the first pad and the second pad,
wherein the another length of the pad from the second plurality of pads is aligned in a diagonal direction relative to the first edge of the integrated device.

5. The device of claim 1,
wherein the first plurality of pads are located along the first edge, a second edge, a third edge and a fourth edge of the integrated device, and
wherein the second plurality of pads are laterally surrounded by the first plurality of pads.

6. The device of claim 1,
wherein at least one pad from the first plurality of pads has a rectangular shape, an oval shape or an oblong shape, and
wherein a portion of a surface of a pad from the first plurality of pads is exposed through an opening in the passivation layer, is not touching a solder interconnect.

7. The device of claim 1,
wherein at least one pad from the second plurality of pads has a rectangular shape, an oval shape or an oblong shape, and
wherein a portion of a surface of a pad from the second plurality of pads is exposed through an opening in the passivation layer, is not touching a solder interconnect.

8. The device of claim 1, further comprising a substrate coupled to the integrated device through a plurality of solder interconnects, wherein the plurality of solder interconnects are coupled to the plurality of pillar interconnects.

9. The device of claim 1, further comprising a board coupled to the integrated device through a plurality of solder interconnects, wherein the plurality of solder interconnects are coupled to the plurality of pillar interconnects.

10. The device of claim 1, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

11. An integrated device comprising:
a die substrate;
an interconnect portion coupled to the die substrate,
wherein the interconnect portion includes a first plurality of pads and a second plurality of pads,
wherein the first plurality of pads are configured to provide a first plurality of electrical paths for input/output signals,
wherein the first plurality of pads comprises a first pad and a second pad,
wherein the first pad has a rectangular shape, an oval shape or an oblong shape,
wherein the second pad has a rectangular shape, an oval shape or an oblong shape,
wherein the first pad includes a length and a width, where the length is greater than the width,
wherein the second pad includes the length and the width,
wherein the length of the first pad is aligned in a diagonal direction relative to a first edge of the integrated device,
wherein the length of the second pad is aligned in a diagonal direction relative to the first edge of the integrated device, and
wherein the second plurality of pads are configured to provide a second plurality of electrical paths for power, and
a passivation layer coupled to the interconnect portion,
wherein the passivation layer comprises a plurality of openings,
wherein the plurality of openings include a first opening and a second opening over the first pad from the first plurality of pads, and
wherein the plurality of openings include a third opening and a fourth opening over the second pad from the first plurality of pads.

12. The integrated device of claim 11, wherein there are at least two openings in the passivation layer that are located over each pad from the first plurality of pads.

13. The integrated device of claim 12, wherein there is one opening in the passivation layer that is located over each pad from the second plurality of pads.

14. The integrated device of claim 12, further comprising a plurality of solder interconnects coupled to the first plurality of pads and the second plurality of pads.

15. The integrated device of claim 14, wherein the plurality of solder interconnects include (i) a first plurality of solder interconnects coupled to the first plurality of pads, and (ii) a second plurality of solder interconnects coupled to the second plurality of pads.

16. The integrated device of claim 15, wherein the first plurality of solder interconnects are coupled to the first plurality of pads through one of the two openings in the passivation layer for each pad from the first plurality of pads.

17. The integrated device of claim 16, wherein for each pad from the first plurality of pads, a first portion of a surface of the pad not covered by the passivation layer is coupled to a solder interconnect, and a second portion of the surface of the pad not covered by the passivation layer is not touching solder interconnect.

18. The integrated device of claim 11, wherein each pad from the first plurality of pads include a length that is aligned in a diagonal direction relative to an edge of the integrated device.

19. The integrated device of claim 11,
wherein the first plurality of pads are located along a periphery of the integrated device, and
wherein the second plurality of pads are laterally surrounded by the first plurality of pads.

20. The integrated device of claim 11, wherein pads from the first plurality of pads have a different shape than pads from the second plurality of pads.

* * * * *